United States Patent
Deak et al.

(10) Patent No.: US 10,330,748 B2
(45) Date of Patent: Jun. 25, 2019

(54) PUSH-PULL X-AXIS MAGNETORESISTIVE SENSOR

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 0 days.

(21) Appl. No.: 15/578,508

(22) PCT Filed: Jun. 1, 2016

(86) PCT No.: PCT/CN2016/084227
§ 371 (c)(1),
(2) Date: Nov. 30, 2017

(87) PCT Pub. No.: WO2016/197840
PCT Pub. Date: Dec. 15, 2016

(65) Prior Publication Data
US 2018/0149715 A1   May 31, 2018

(30) Foreign Application Priority Data
Jun. 9, 2015 (CN) .......................... 2015 1 0312173

(51) Int. Cl.
*G01R 33/09* (2006.01)
*G01R 33/00* (2006.01)
(52) U.S. Cl.
CPC ....... *G01R 33/093* (2013.01); *G01R 33/0005* (2013.01); *G01R 33/09* (2013.01)
(58) Field of Classification Search
CPC .......................... G01R 33/0005; G01R 33/09; G01R 33/0023
See application file for complete search history.

(56) References Cited

U.S. PATENT DOCUMENTS

| | | | | |
|---|---|---|---|---|
| 2014/0021571 A1* | 1/2014 | Lei | ............................ | G01B 7/30 257/427 |
| 2014/0035570 A1* | 2/2014 | Jin | ...................... | G01R 33/0005 324/252 |
| 2014/0203384 A1* | 7/2014 | Deak | .................... | G01R 33/098 257/427 |

FOREIGN PATENT DOCUMENTS

| | | |
|---|---|---|
| CN | 103630855 | 3/2014 |
| CN | 104272129 | 1/2015 |

(Continued)

OTHER PUBLICATIONS

"International Application No. PCT/CN2016/084227, International Search Report and Written Opinion dated Aug. 29, 2016", (Aug. 29, 2016), 12 pgs.

*Primary Examiner* — Jermele M Hollington
*Assistant Examiner* — Alvaro E Fortich
(74) *Attorney, Agent, or Firm* — Schwegman Lundberg & Woessner, P.A.

(57) ABSTRACT

A push-pull X-axis magnetoresistive sensor, comprising: a substrate upon which an interlocked array of soft ferromagnetic flux concentrators and a push-pull magnetoresistive sensor bridge unit are placed. It further may comprise calibration coils and/or initialization coils. At least one of each of the soft ferromagnetic flux concentrators is present such that an interlocking structure may be formed such that there are alternately interlocked and non-interlocked gaps along the X direction. Push/pull magnetoresistive sensing unit strings are respectively located in the interlocked and non-interlocked gaps and are electrically connected to form a push-pull magnetoresistive bridge sensing unit. This magnetoresistive sensing unit is sensitive to magnetic field along the X direction. The calibration coils and initialization coils are respectively compromised of straight calibration conductors and straight initialization conductors that run paral- (Continued)

lel and perpendicular to the push-pull magnetoresistive sensing unit strings. The structure of this push-pull X-axis magnetoresistive sensor is simple to implement. It has the advantages of high magnetic field sensitivity comparing to a referenced bridge X-axis magnetoresistive sensor as well as low power consumption.

24 Claims, 19 Drawing Sheets

(56) References Cited

FOREIGN PATENT DOCUMENTS

| | | |
|---|---|---|
| CN | 104280700 | 1/2015 |
| CN | 104656045 | 5/2015 |
| CN | 105093139 | 11/2015 |
| CN | 204758807 | 11/2015 |
| WO | WO-2014059110 | 4/2014 |
| WO | WO-2016197840 | 12/2016 |

* cited by examiner

PUSH-PULL X-AXIS MAGNETORESISTIVE SENSOR

PRIORITY CLAIM TO RELATED APPLICATIONS

This application is a U.S. national stage application filed under 35 U.S.C. § 371 from International Application Serial No. PCT/CN2016/084227, which was filed 1 Jun. 2016, and published as WO2016/197840 on 15 Dec. 2016, and which claims priority to China Application No. 201510312173.1, filed 9 Jun. 2015, which applications and publication are incorporated by reference as if reproduced herein and made a part hereof in their entirety, and the benefit of priority of each of which is claimed herein.

TECHNICAL FIELD

The present invention relates to the field of magnetic sensors, and in particular, to a push-pull X-axis magnetoresistive sensor.

BACKGROUND ART

In order to achieve a two-axis or a three-axis magnetic compass chip, it is necessary to employ highly sensitive X-axis and Y-axis magnetic field sensors at the same time in the device. Magnetoresistive sensing units generally are sensitive to a magnetic field applied in a single direction. For a magnetoresistive bridge sensing unit structure, the bridge should only respond as the magnetic field changes to a magnetic field applied in an X direction, and the bridge should have no response when a magnetic field is applied in a Y direction. To improve magnetic field sensitivity, a push-pull bridge is often employed, where a push arm and a pull arm are located on separate chips, wherein one chip is rotated 180 degrees relative to the other, and the chips of the push arm and the pull arm are then connected using wirebonds.

The above-mentioned Y-axis magnetoresistive sensor has the following problems: the push arm and the pull arm cannot be manufactured on a single substrate; the wirebonding process for connecting the discrete chips increases the process complexity; and the measurement accuracy of the sensor is degraded.

SUMMARY OF THE INVENTION

To solve the above existing problems, the present invention proposes a push-pull X-axis magnetoresistive sensor, utilizing a magnetic circuit comprised of interlocked U-shaped, H-shaped, or U-H hybrid soft ferromagnetic flux concentrators, and realizes conversion of an external X magnetic field into an enhanced magnetic field having an X magnetic field sensitive direction wherein an X-direction push arm and a −X-direction pull arm have opposite magnetoresistive changes. When a Y-direction external magnetic field is applied, the push-arm magnetoresistive sensing unit is exposed to an X magnetic field component with alternating opposite magnetic fields producing a final average magnetic field of 0, while additionally the pull arm also produces a very small magnetoresistive change as the magnetic field changes. As a result, the push-pull magnetoresistive bridge sensing unit has enhanced output signal in response to an X magnetic field and a screening effect in response to a Y magnetic field.

A push-pull X-axis magnetoresistive sensor according to the present invention includes: a substrate, an interlocked array of soft ferromagnetic flux concentrators, and a push-pull magnetoresistive bridge sensing unit placed on the substrate.

The interlocked array of soft ferromagnetic flux concentrators includes at least two soft ferromagnetic flux concentrators. Each of the soft ferromagnetic flux concentrators includes a rectangular positive X-direction bar bar1, a negative X-direction bar bar2, and a magnetoresistive bridge-0. The bar bar1 and the bar bar2 have major axes parallel to a Y-axis direction and minor axes parallel to an X-axis direction. The magnetoresistive bridge-0 has a major axis parallel to the X-axis and a minor axis parallel to the Y-axis, and two ends of the major axis are interconnected with the bar bar1 and the bar bar2 respectively. The soft ferromagnetic flux concentrators form an interlocking structure, and form interlocked gaps GapX1 and non-interlocked gaps GapX2 along the X direction.

The push-pull magnetoresistive bridge sensing unit includes at least a push arm and a pull arm. The push arm includes at least one push magnetoresistive sensing unit string, and the pull arm includes at least one pull magnetoresistive sensing unit string. The push and pull magnetoresistive sensing unit strings both include multiple interconnected magnetoresistive sensing units. The push magnetoresistive sensing unit strings are located at the interlocked gaps GapX1, and the pull magnetoresistive sensing unit strings are located at the non-interlocked gaps GapX2. The magnetoresistive sensing unit is sensitive to magnetic field along the X direction.

The push-pull X-axis magnetoresistive sensor further includes calibration coils and/or initialization coils. The calibration coils are comprised of push straight calibration conductors and pull straight calibration conductors that run parallel to the push and pull magnetoresistive sensing unit strings. When a calibration current flows through the calibration coils, calibration magnetic field components having identical amplitudes along the X direction and the −X direction are generated respectively at the push magnetoresistive sensing unit strings and the pull magnetoresistive sensing unit strings.

The initialization coils include straight initialization conductors that run perpendicular to the magnetoresistive sensing unit strings. When an initialization current flows into the initialization coils, initialization magnetic field components having identical amplitudes along the Y direction are generated at all the magnetoresistive sensing units.

The soft ferromagnetic flux concentrators are U-shaped or H-shaped. Positive Y ends or negative Y ends of the bars bar1 and the bars bar2 of the U-shaped soft ferromagnetic flux concentrators are aligned, and are connected to the magnetoresistive bridge-0. U gaps are formed between the bars bar1 and the bars bar2. The magnetoresistive bridge-0s of the H-shaped soft ferromagnetic flux concentrators are connected to midpoints of the bars bar1 and the bars bar2. H gaps are formed between the bars bar1 and the bars bar2. The H gaps are classified into positive H gaps and negative H gaps according to the Y-axis directions.

The interlocked array of soft ferromagnetic flux concentrators is formed by the U-shaped soft ferromagnetic flux concentrators, or the H-shaped soft ferromagnetic flux concentrators, or the U-shaped soft ferromagnetic flux concentrators and the H-shaped soft ferromagnetic flux concentrators. One interlocked gap column is formed along the X direction. For any of the soft ferromagnetic flux concentrators, at least another of the soft ferromagnetic flux concentrators is present such that an interlocking structure may be formed. Major axes of the positive X-direction bars bar1 and the negative X-direction bars bar2 span all the interlocked gaps in the Y direction.

The interlocked array of soft ferromagnetic flux concentrators is formed by the U-shaped and H-shaped soft ferromagnetic flux concentrators, or is formed merely by the H-shaped soft ferromagnetic flux concentrators. An interlocked array of gaps having M rows and N columns is formed. In the Y direction, the $1^{st}$ column and the $N^{th}$ column of the interlocked gaps are the interlocked gaps between the H-shaped and U-shaped soft ferromagnetic flux concentrators or the interlocking structure between the H-shaped soft ferromagnetic flux concentrators. When N is an integer greater than or equal to 3, the $2^{nd}$ column to the $(N-1)^{th}$ column of the interlocked gaps in the middle all correspond to the interlocking structure between the H-shaped soft ferromagnetic flux concentrators.

In the X direction, each column includes M interlocked gaps. The positive X-direction bars bar1 of all the topmost soft ferromagnetic flux concentrators and the negative X-direction bars bar2 of all the bottommost soft ferromagnetic flux concentrators are combined into a D1 end bar and a D2 end bar, respectively. Major axes of the D1 and D2 end bars span all the interlocked gaps in the Y direction. M and N are integers greater than or equal to 2.

When a total quantity K of the soft ferromagnetic flux concentrators in the interlocked gap column is an odd number, an odd gap set A formed by numerical labels of the interlocked gaps and the non-interlocked gaps is:

A=[−(n1+0.5), −n1, . . . , −1.5, −1, 0, 1, 1.5, . . . , n1, n1+0.5];

an odd interlocked gap set is: A1=[−n1, . . . , −1, 1, . . . , n1]; and an odd non-interlocked gap set is:

A2=[−(n1+0.5), . . . , −1.5, 1.5, . . . , n1+0.5]; and when the quantity K of the soft ferromagnetic flux concentrators is an even number, an even gap set B is:

B=[−(n2+0.5), −n2, . . . , −1, −0.5, 0, 0.5, 1, . . . , n2, (n2+0.5)]; (n2 is an integer greater than or equal to 0)

an even interlocked gap set is: B1=[−n2; . . . , −1, 1, . . . , n2]; and an even non-interlocked gap set is: B2=[−n2−0.5, . . . , −0.5, 0.5, n2+0.5];

wherein 0 corresponds to a label of the middle gap, positive integers and positive fractions respectively correspond to labels of the interlocked gaps and non-interlocked gaps in the positive X direction, and negative integers and negative fractions respectively correspond to labels of the interlocked gaps and non-interlocked gaps in the negative X direction;

when K is an odd number, odd push arm sets are:

A11=[1, 2, 3, . . . , n1] and A12=[−1, −2, −3, . . . , −n1]

wherein the magnetoresistive sensing unit strings at the interlocked gaps form the push arm sets;

odd pull arm sets are:

A21=[1.5, 2.5, 3.5, . . . , n1+0.5] and A22=[−1.5, −2.5, −3.5, . . . , −(n1+0.5)];

wherein the magnetoresistive sensing unit strings at the non-interlocked gaps form the pull arm sets;

when K is an even number, even push arm sets are:

B11=[1, 2, 3, . . . , n2] and B12=[−1, −2, −3, . . . , −n2];

wherein the magnetoresistive sensing unit strings at the interlocked gaps form the push arm sets;

and even pull arm sets are:

B21=[0.5, 1.5, 2.5, . . . , (n2+0.5)] and B22=[−0.5, −1.5, −2.5, . . . , −(n2+0.5)];

wherein the magnetoresistive sensing unit strings at the non-interlocked gaps form the pull arm sets;

the n1=(K−1)/2, and the n2=(K−2)/2.

In the any $J^{th}$ interlocked gap column, nJ elements are selected randomly from the odd or even push arm set A11(J) or B11(J): n1≥J≥1 or n2≥J≥1, and nJ≥1;

$a_{1,J}, a_{2,J}, a_{3,J}, \ldots, a_{nJ}$, wherein a difference between two adjacent elements is greater than 2, and there exists:

$a_{11,J}=a_{1,J}\pm1, a_{21,J}=a_{2,J}\pm1, a_{31,J}=a_{3,J}\pm1, \ldots, a_{n1,J}=a_{nJ}\pm1$ Push(J) sets are formed as:

Push(J)=[$a_{1,J}, a_{11,J}, a_{2,J}, a_{21,J}, a_{3,J}, a_{31,J}, \ldots, a_{nJ}, a_{n1,J}$]

and [$-a_{1,J}, -a_{11,J}, -a_{2,J}, -a_{22,J}, -a_{3,J}, -a_{31,J}, \ldots, -a_{nJ}, -a_{n1,J}$], and there exists $a_{10,J}=a_{1,J}\pm0.5, a_{110,J}=a_{11,J}\pm0.5, a_{20,J}=a_{2,J}\pm0.5, a_{210,J}=a_{21,J}\pm0.5, a_{30,J}=a_{3,J}\pm0.5, a_{310,J}=a_{31,J}\pm0.5, \ldots, a_{n0,J}=a_{nJ}\pm0.5, a_{n10,J}=a_{n1,J}\pm0.5$ Pull(J) sets are formed as:

Pull(J)=[$a_{10,J}, a_{110,J}, a_{20,J}, a_{210,J}, a_{30,J}, a_{310,J}, \ldots, a_{n0,J}, a_{n10,J}$]

and [$-a_{10,J}, -a_{110,J}, -a_{20,J}, -a_{210,J}, -a_{30,J}, -a_{310,J}, \ldots, -a_{n0,J}, -a_{n10,J}$], the push magnetoresistive sensing unit strings in the Pull(J) sets form the push magnetoresistive sensing unit strings of the $J^{th}$ interlocked gap column, and the pull magnetoresistive sensing unit strings in the Pull(J) sets form the pull magnetoresistive sensing unit strings of the $J^{th}$ interlocked gap column.

When the interlocked array of soft ferromagnetic flux concentrators is formed by M interlocked gap columns, for the $J^{th}$ interlocked gap column, one Pull(J) and one Push(J) as stated above are present, thus forming a Pull set:

Pull={Pull(1), Pull(2), Pull(3), . . . , Pull(M)}, and a Push set:

Push={Push(1), Push(2), Push(3), . . . , Push(M)}, then, the push arm of the push-pull X-axis magnetoresistive sensor is a serial connection between the push magnetoresistive sensing unit strings corresponding to the Push(J) sets corresponding to the J columns, and the pull arm is a serial connection between the pull magnetoresistive sensing unit strings corresponding to the Pull(J) sets corresponding to the J columns.

When two magnetoresistive sensing unit strings having identical resistances are located simultaneously at a first-type non-interlocked gap formed by two H-shaped soft ferromagnetic flux concentrators, the magnetoresistive sensing unit strings are combined into one magnetoresistive sensing unit string, and a resistance thereof is twice that of any of the two magnetoresistive sensing unit strings.

The push-pull bridge sensor may be formed through connection as a half-bridge, full-bridge, or quasi-bridge structure.

The magnetoresistive sensing units are GMR spin valves or TMR sensing units, wherein the directions of pinning layers are parallel to the X-axis, and the directions of free layers are parallel to the Y-axis.

In the presence of an external magnetic field, the magnetoresistive sensing units make magnetization directions of magnetic free layers perpendicular to magnetization directions of magnetic pinning layers thereof by permanent magnet biasing, double exchange interaction, shape anisotropy or any combination thereof.

The push arm and the pull arm have the same quantity of magnetoresistive sensing units.

The calibration coil includes push straight calibration conductors and pull straight calibration conductors, a position relation between the push straight calibration conductor and the push magnetoresistive sensing unit string is the same as that between the pull straight calibration conductor and the pull magnetoresistive sensing unit string, the position relation is that the straight conductor is located directly above or directly below the corresponding magnetoresistive sensing unit string, and the push straight calibration conductor and the pull straight calibration conductor are connected in series and have opposite current directions.

The initialization coil is a planar coil, and the straight initialization conductors included therein are perpendicular to the push magnetoresistive sensing unit string and the pull magnetoresistive sensing unit string, are located directly above or directly below each magnetoresistive sensing unit string, and have identical current directions.

The calibration coil includes a positive port and a negative port, and when a current flows through the two ports, an amplitude range of a calibration magnetic field generated thereby is within a linear working area of the magnetoresistive sensing unit.

The calibration current may be set to one current value or multiple current values.

The initialization coil includes two ports, and when a current flows through the two ports, the magnitude of an initialization magnetic field generated thereby is higher than a saturated magnetic field value of the magnetoresistive sensing unit.

The initialization current may be a pulse current or a direct current.

The initialization coil and the calibration coil are made of a high-conductivity material, including Cu, Au, or Ag.

The soft ferromagnetic flux concentrator is made of an alloy soft ferromagnetic material that includes one or more elements of Fe, Ni, Co, and the like.

The material of the substrate is glass or a silicon wafer, and the substrate includes an ASIC or the substrate is connected to another ASIC chip.

The initialization coil and/or the calibration coil are/is located above the substrate and below the magnetoresistive sensing unit, or between the magnetoresistive sensing unit and the soft ferromagnetic flux guide, or above the soft ferromagnetic flux guide.

The initialization coil and/or the calibration coil are/is isolated from the interlocked U-shaped or/and H-shaped soft ferromagnetic flux guides and the push-pull magnetoresistive bridge sensing unit by using an insulating material, and the insulating material is $SiO_2$, $Al_2O_3$, $Si_3N_4$, polyimide, or photoresist.

DETAILED DESCRIPTION

The present invention will be described below in detail with reference to the accompanying drawings and in combination with the embodiments.

Embodiment 1

Figure 1:
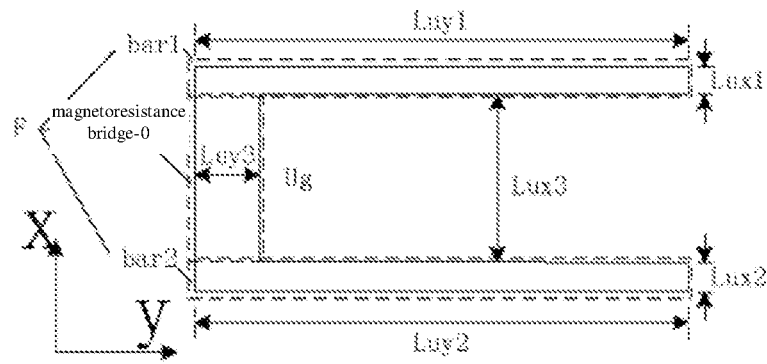
FIG. 1 is a structural diagram of a U-shaped soft ferromagnetic flux concentrator.
Figure 2:
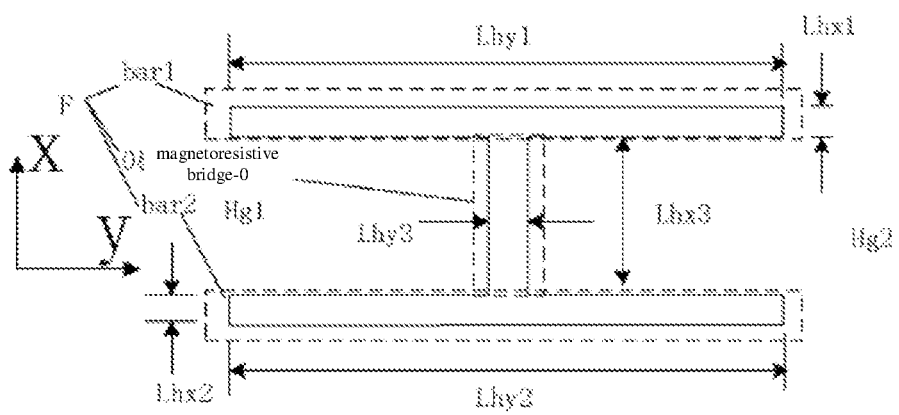
FIG. 2 is a structural diagram of an H-shaped soft ferromagnetic flux concentrator.

FIG. 1 and FIG. 2 are structural diagrams of two typical soft ferromagnetic flux concentrators respectively. FIG. 1 is a U-shaped soft ferromagnetic flux concentrator, and FIG. 2 is an H-shaped soft ferromagnetic flux concentrator. The soft ferromagnetic flux concentrators both include two rectangular bars bar1 and bar2, and a magnetoresistive bridge-0. The bar bar1 is located in a positive X direction, the bar bar2 is located in a negative X direction, major axes of the two are in a Y direction, and minor axes of the two are in the X direction. The magnetoresistive bridge-0 is also rectangular, a major axis thereof is along the X direction, a minor axis thereof is along the Y direction, and two ends of the major axis of the magnetoresistive bridge-0 connect the bars bar1 and bar2. For the U-shaped soft ferromagnetic flux concentrator shown in FIG. 1, positive Y ends and/or negative Y ends of the bar bar1 and the bar bar2 are aligned, the positive Y ends or negative Y ends of the bar bar1 and the bar bar2 are connected to the magnetoresistive bridge-0, and a Ug gap is formed between the bar bar1 and the bar bar2. For the H-shaped soft ferromagnetic flux concentrator shown in FIG. 2, midpoints of the bar bar1 and the bar bar2 are connected via the magnetoresistive bridge-0, and a negative Y-direction gap Hg1 and a positive Y-direction gap Hg2 are formed between the bar bar1 and the bar bar2.

Figure 3:
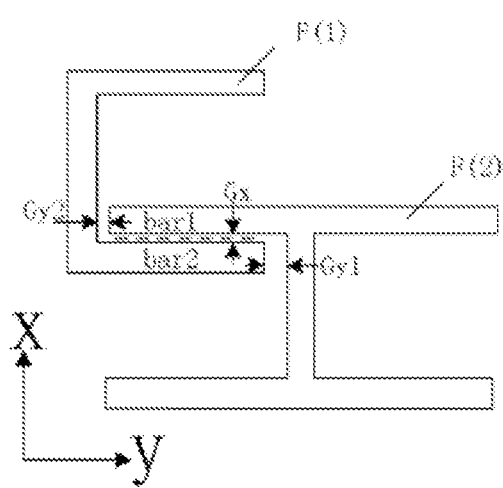
FIG. 3 is a diagram of interlocked gaps of a soft ferromagnetic flux concentrator.

FIG. 3 is a schematic diagram of an interlocking structure, formed by two soft ferromagnetic flux concentrators, and corresponding interlocked gaps. FIG. 3 shows an interlocking structure formed by a soft ferromagnetic flux concentrator F(1) and a soft ferromagnetic flux concentrator F(2). One of bars bar2 of the soft ferromagnetic flux concentrator F(1) enters a gap Hg1 of the soft ferromagnetic flux concentrator F(2), one of bars bar1 of the soft ferromagnetic flux concentrator F(2) enters a gap Ug, Hg1, or Hg2 of the soft ferromagnetic flux concentrator F(1), and it is considered that the F(1) and F(2) form an interlocking structure. Interlocked gaps Gx are formed between the bar1 and the bar2 along the X direction, and a positive Y-direction gap Gy1 and a negative Y-direction gap Gy2 are formed along the Y direction. For ease of illustration, this drawing merely shows a situation where a U-shaped soft ferromagnetic flux concentrator and a H-shaped soft ferromagnetic flux concentrator are included. In fact, two U-shaped soft ferromagnetic flux concentrators or two H-shaped soft ferromagnetic flux concentrators may further be included.

Figure 4:
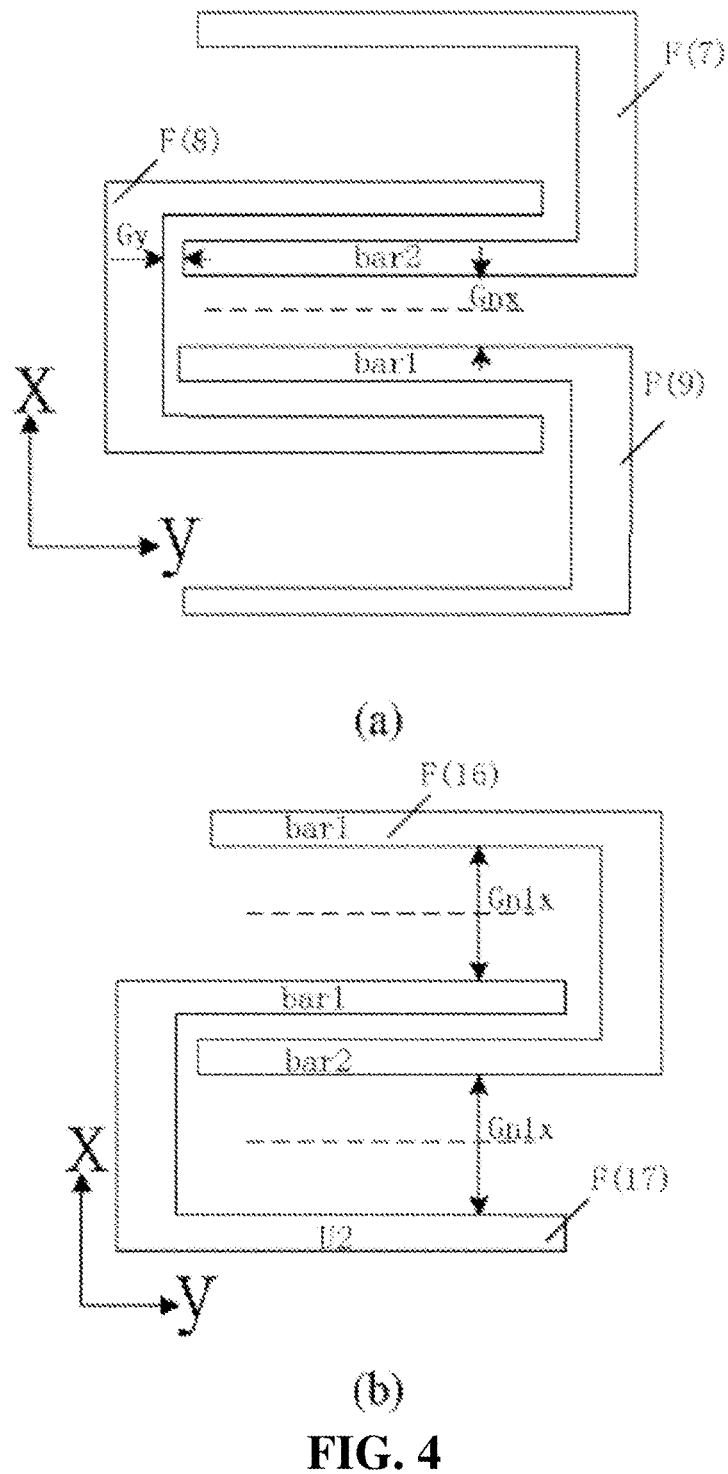
FIG. 4 is a diagram of non-interlocked gaps of a soft ferromagnetic flux concentrator: a) a first type of non-interlocked gaps; b) a second type of non-interlocked gaps.

FIG. 4 is a schematic diagram of forming non-interlocked gaps between soft ferromagnetic flux concentrators. The non-interlocked gaps have two forms, i.e., a first type of non-interlocked gaps and a second type of non-interlocked gaps. In FIG. 4(a), a bar bar2 of a soft ferromagnetic flux concentrator F(7) and a bar bar1 of a soft ferromagnetic flux concentrator F(9) enter a gap Ug, Hg1 or Hg2 of F(8) at the same time. The soft ferromagnetic flux concentrator F(7) and the soft ferromagnetic flux concentrator F(9) form an interlocking structure with the soft ferromagnetic flux concentrator F(8) respectively, and the first type of non-interlocked gaps Gnx are formed between the bar1 of the soft ferromagnetic flux concentrator F(9) and the bar2 of the soft ferromagnetic flux concentrator F(7) along the X direction.

FIG. 4(b) shows the second type of non-interlocked gaps. Only a bar bar1 of a soft ferromagnetic flux concentrator F(17) that forms an interlocking structure with a soft ferromagnetic flux concentrator F(16) enters a gap Ug, Hg1 or Hg2 of the soft ferromagnetic flux concentrator F(16), and in this case, the second type of non-interlocked gaps Gn1x are formed between the bar bar1 of the soft ferromagnetic flux concentrator F(16) and the bar bar1 of the soft ferromagnetic flux concentrator F(17), and the second type of non-interlocked gaps Gn1x are also formed between two bars bar2 along the X direction.

Embodiment 2

For push-pull X-axis magnetoresistive sensors corresponding to the three kinds of interlocked array of soft ferromagnetic flux concentrators including U-shaped soft ferromagnetic flux concentrators, H-shaped soft ferromagnetic flux concentrators, and U-shaped and H-shaped hybrid soft ferromagnetic flux concentrators, magnetoresistive sensing unit strings are located at interlocked gaps and non-interlocked gaps respectively, and the push-pull X-axis magnetoresistive sensor is formed by interconnection of the magnetoresistive sensing unit strings. The most important feature of the push-pull X-axis magnetoresistive sensor lies in that it has an enhanced measurement function for an external X magnetic field and a cancellation effect for an external Y magnetic field. To determine attributes of multiple magnetoresistive sensing unit strings in the interlocked array of the soft ferromagnetic flux concentrators conveniently, i.e., to determine whether each of the magnetoresistive sensing unit strings belongs to a push arm or a pull arm and determine a connection relationship between them, it is necessary to label all the interlocked gaps and the non-interlocked gaps.

Figure 5:
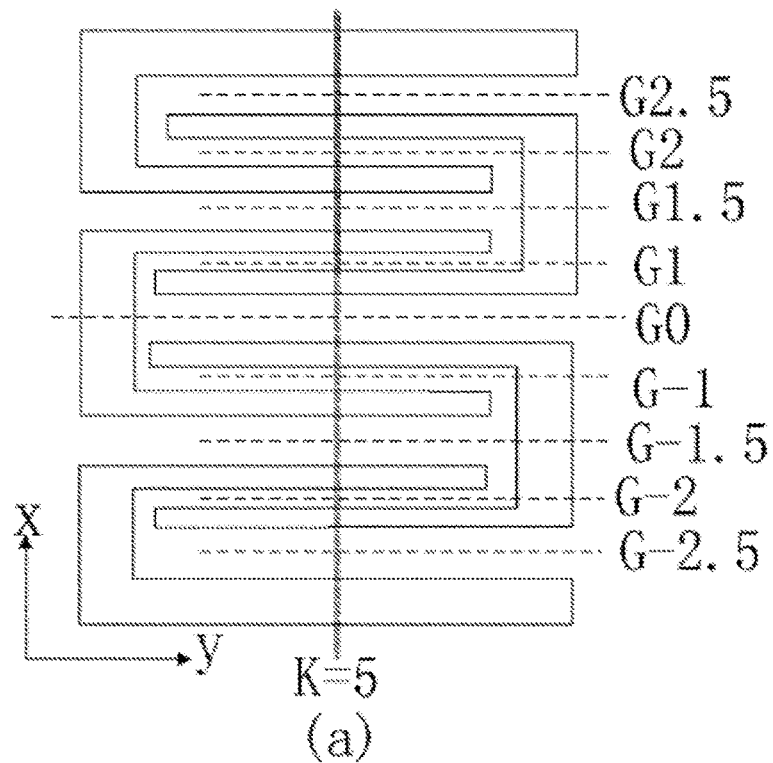
FIG. 5 shows a single gap column of an interlocked array of soft ferromagnetic flux concentrators and a label of the single gap column: a) the quantity K of the soft ferromagnetic flux concentrators is an odd number, b) the quantity K of the soft ferromagnetic flux concentrators is an even number.
Figure 5:
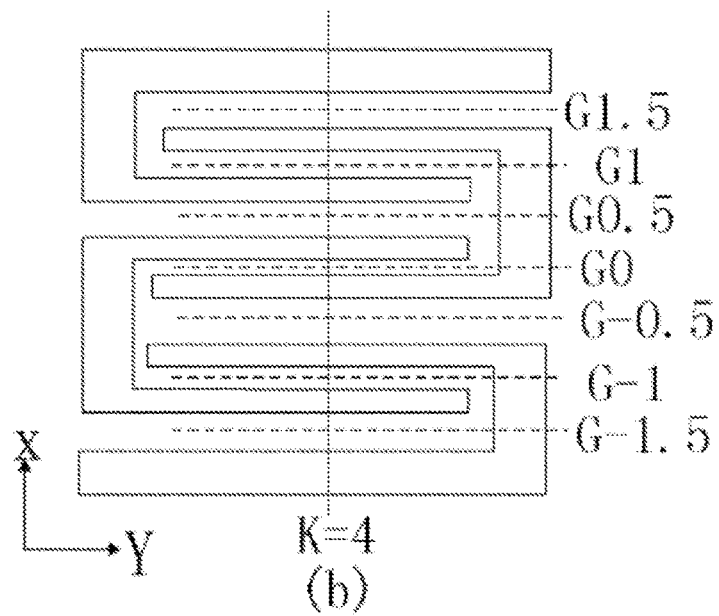

Along the X direction, the interlocked gaps and the non-interlocked gaps are arranged alternately, as shown in FIG. 5(a). When the quantity K of the soft ferromagnetic flux concentrators is an odd number, in this case, an odd gap set formed by numerical labels of the interlocked gaps and the non-interlocked gaps is defined as:

$A=[-(n1+0.5), -n1, \ldots, -1.5, -1, 0, 1, 1.5, \ldots, n1, n1+0.5]$;

odd interlocked gaps are defined as: $A1=[-n1, -1, 1, \ldots, n1]$; $n1=(K-1)/2$ odd non-interlocked gaps are defined as:

$A2=[-(n1+0.5), \ldots, -1.5, 1.5, \ldots, n1+0.5]$;

when the quantity K of the soft ferromagnetic flux concentrators in the gap column is an even number, as shown in FIG. 5(b), in this case, an even gap set is defined as: $B=[-(n2-0.5), -n2, \ldots, -1, -0.5, 0, 0.5, 1, \ldots, n2, (n2+0.5)]$;

even interlocked gaps are defined as: $B1=[-n2; \ldots, -1, 1, \ldots, n2]$; $n2=(K-2)/2$ even non-interlocked gaps are defined as: $B2=[-n2-0.5, \ldots, -0.5, 0.5, n2+0.5]$;

wherein 0 corresponds to a label of the middle gap, positive integers and positive fractions respectively correspond to labels of the interlocked gaps and non-interlocked gaps in the positive X direction, and negative integers and negative fractions respectively correspond to labels of the interlocked gaps and non-interlocked gaps in the negative X direction.

Figure 6:
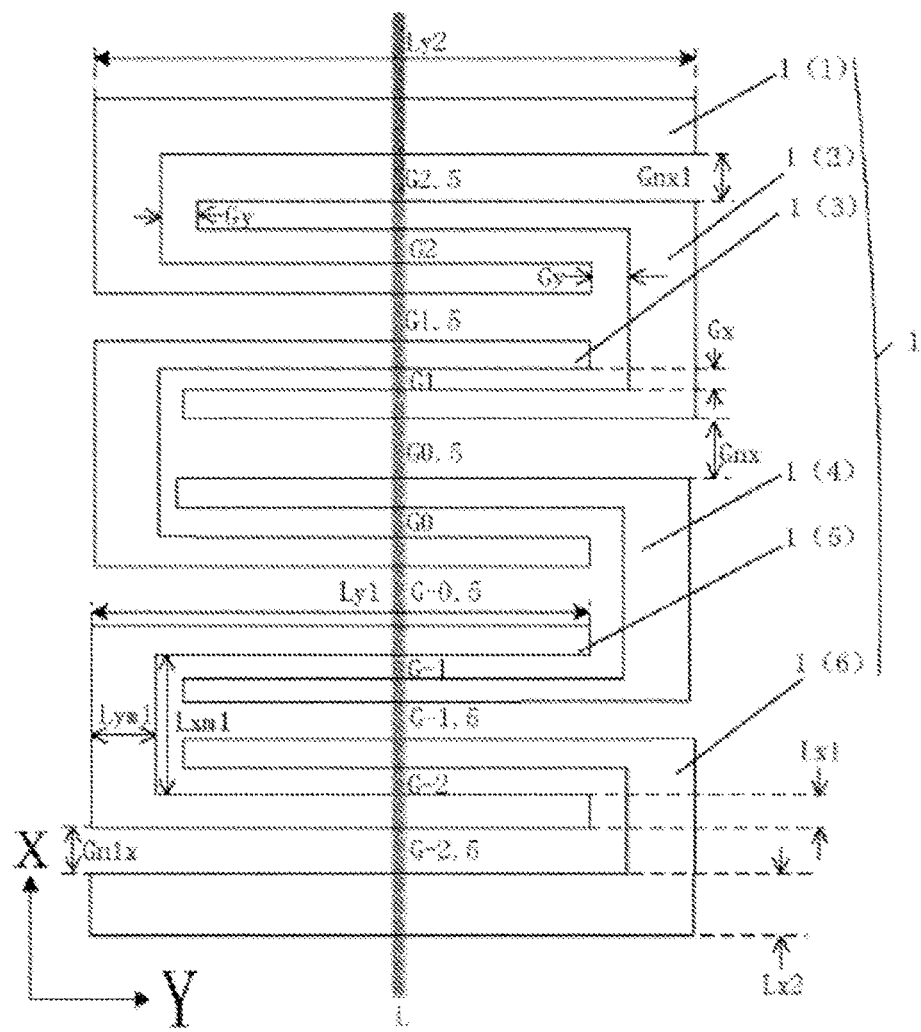
FIG. 6 is a structural diagram of an interlocked array of U-shaped soft ferromagnetic flux concentrators.

FIG. 6 is an interlocked array 1 of U-shaped soft ferromagnetic flux concentrators when the quantity K of the soft ferromagnetic flux concentrators is 6, including 1(1), 1(2), . . . , 1(N) (N is an integer greater than or equal to 3) U-shaped soft ferromagnetic flux concentrators. The $1(m)^{th}$ (m is an integer greater than 1 and less than or equal to N) U-shaped soft ferromagnetic flux concentrators and the $1(m-1)^{th}$ U-shaped soft ferromagnetic flux concentrators form an interlocking structure, interlocked gaps are all Gx, and gaps in the positive Y-direction and the negative Y-direction are both Gy. Moreover, the first type of non-interlocked gaps are Gnx, and the second type of non-interlocked gaps are Gnx1. N may be an odd number or an even number, and in this embodiment, N=6. The $2^{nd}$ to the $(N-1)^{th}$ U-shaped soft ferromagnetic flux concentrators in the middle have identical dimensions, major axes of the bars bar1 and bar2 thereof in the Y direction are Ly1, and minor axes are Lx1. The magnetoresistive bridge-0 has a Y-direction dimension being Lym1 and an X-direction dimension being Lxm1. Non-interlocked bars of the $1^{st}$ and the $N^{th}$ U-shaped soft ferromagnetic flux concentrators, i.e., the bar bar1 of the $1^{st}$ U-shaped soft ferromagnetic flux concentrator and the bar bar2 of the $N^{th}$ U-shaped soft ferromagnetic flux concentrator have a Y-direction dimension being Ly2=Ly1+Gy, and an X-direction dimension being Lx2. Lx2 is greater than Lx1.

Figure 7:
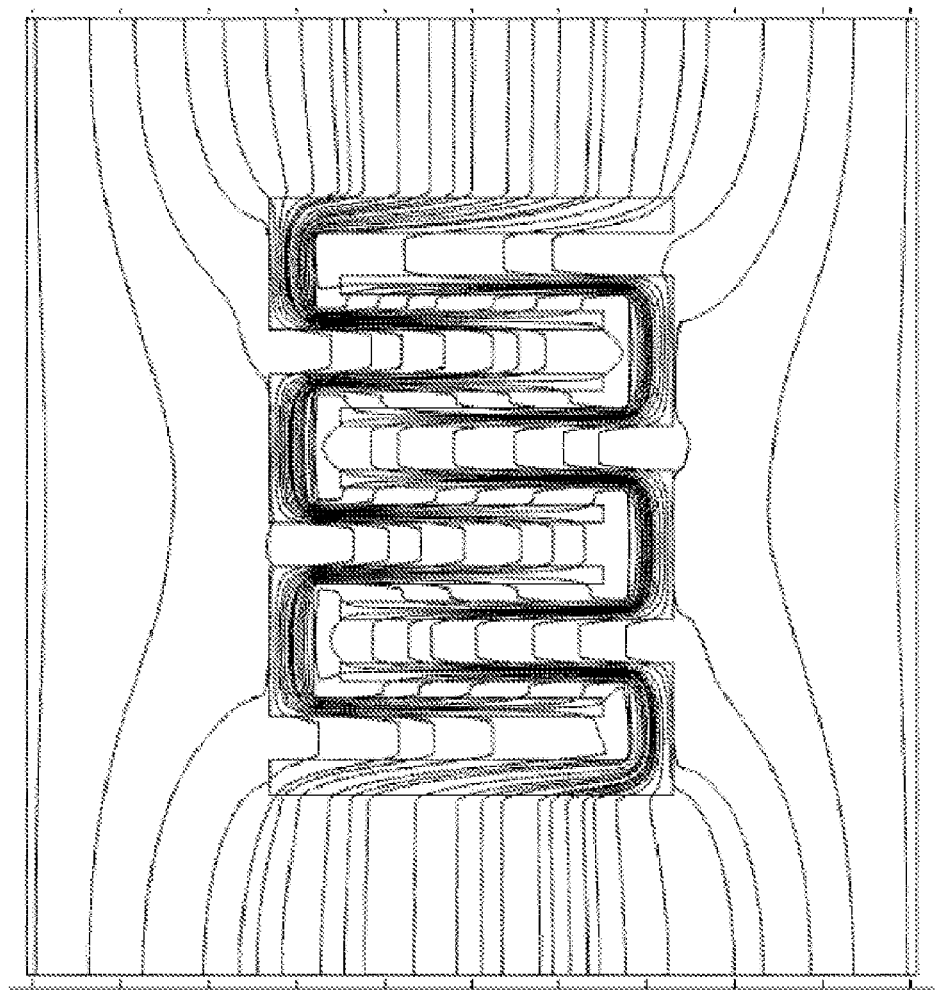
FIG. 7 is a distribution diagram of magnetic force lines of an interlocked array structure of U-shaped soft ferromagnetic flux concentrators in an external X magnetic field.
Figure 8:
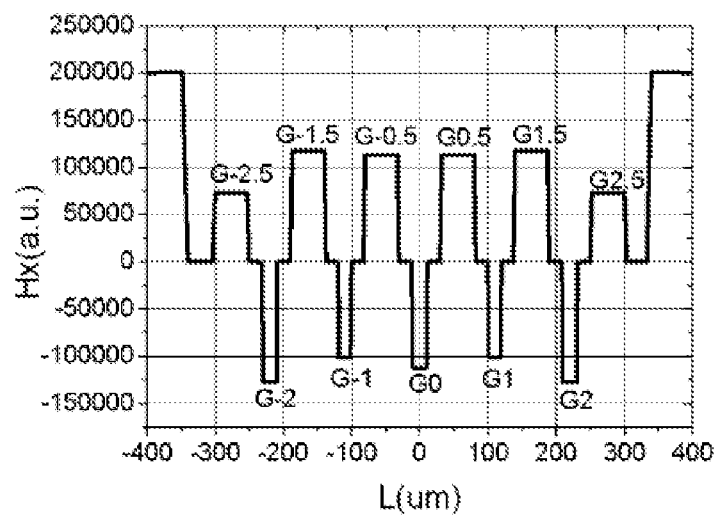
FIG. 8 is a distribution diagram of Hx magnetic field components at L gap columns in the external X magnetic field.

FIG. 7 is a distribution diagram of magnetic force lines of an interlocked array 1 of U-shaped soft ferromagnetic flux concentrators under the effect of an x-direction external magnetic field. It can be seen that, X-direction magnetic field distribution features are present in the middle of interlocked gaps and non-interlocked gaps. Distribution of X-direction magnetic field components on a straight line L shown in FIG. 6 is as shown in FIG. 8, and magnetic fields at all gaps are symmetric with respect to G0. Adjacent gaps in the negative X-direction, i.e., G−0.5/G−1 and G−1.5/G−2 have magnetic fields in opposite directions and approximate amplitudes. Likewise, G0.5/G1 and G1.5/G2 also have magnetic fields in opposite directions and approximate amplitudes according to symmetry.

Figure 9:
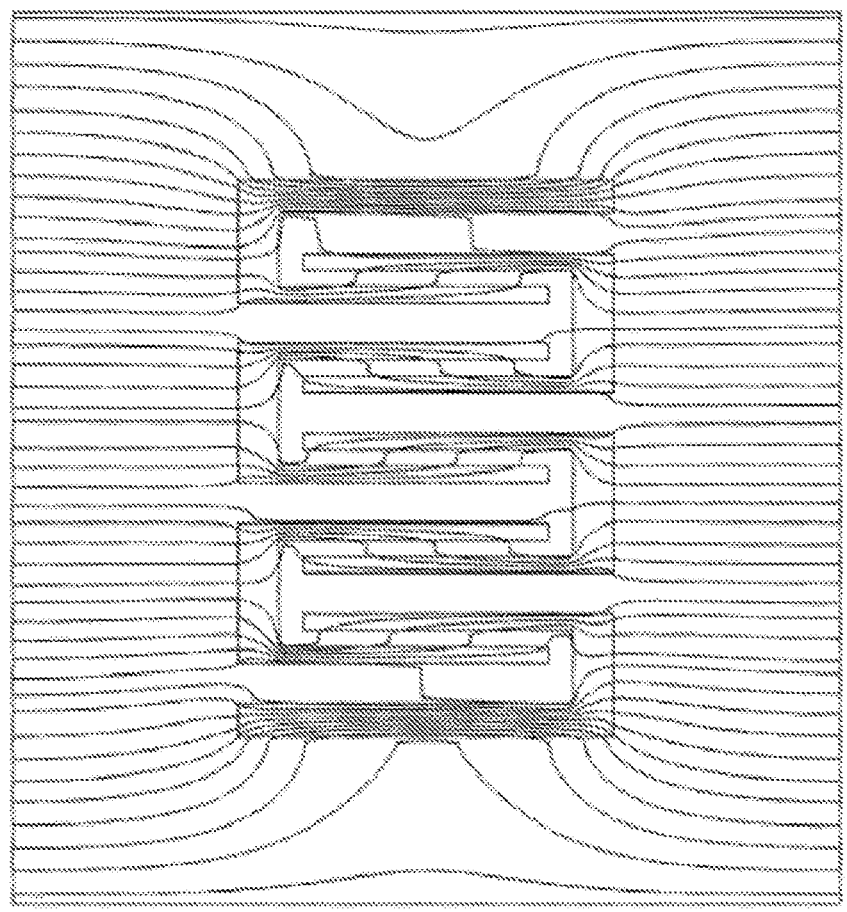
FIG. 9 is a distribution diagram of magnetic force lines of an interlocked array structure of U-shaped soft ferromagnetic flux concentrators in an external Y magnetic field.
Figure 10:
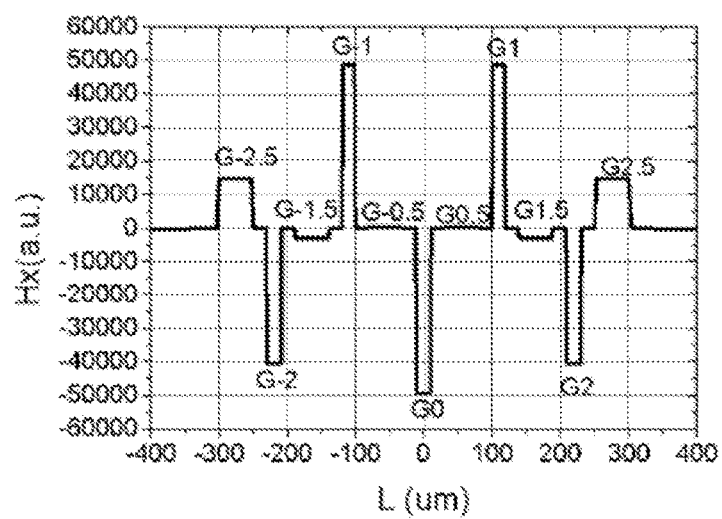
FIG. 10 is a distribution diagram of Hx magnetic field components at L gap columns in the external Y magnetic field.

FIG. 9 shows a distribution diagram of magnetic force lines of an interlocked array 1 of U-shaped soft ferromagnetic flux concentrators under the effect of a y-direction external magnetic field. It can be seen that, X-direction magnetic field distribution features are also present in the middle of interlocked gaps and non-interlocked gaps, X-direction magnetic field distribution on the straight line L shown in FIG. 6 is as shown in FIG. 10, and magnetic fields at all gaps are also symmetric with respect to G0. At the gaps labeled with fractions, magnetic fields at the first type of non-interlocked gaps all approximate to 0, or G−2.5 and G2.5 magnetic fields at the second type of non-interlocked gaps have small amplitude changes at the external X magnetic field and the external Y magnetic field. The interlocked gaps G−1 and G−2 have magnetic fields in opposite directions and approximate amplitudes, and because of symmetry, G1 and G2 also have magnetic fields in opposite directions and approximate amplitudes.

What described above are Hx magnetic field distribution features of the interlocked gaps and the non-interlocked gaps in an X-direction gap column. A push-pull X-axis magnetoresistive sensor is characterized in that: in the external X magnetic field, connections of the magnetoresistive sensing unit strings of the push-pull magnetoresistive sensor can generate an enhanced output, and in the external Y magnetic field, connections of the magnetoresistive sensing unit strings of the push-pull magnetoresistive sensor can generate a cancellation effect.

When the magnetoresistive sensing unit strings are placed, the push magnetoresistive sensing unit strings are placed at the interlocked gaps, and the pull magnetoresistive sensing unit strings are placed at the non-interlocked gaps. At the same time, for a full-bridge structure, as there are two push arms and two pull arms, it is correspondingly required that the push magnetoresistive sensing unit strings and the pull magnetoresistive sensing unit strings have symmetric features in distribution. For example, in FIG. 8, two adjacent interlocked gaps have opposite features. Therefore, if the two are used as a push arm and a pull arm respectively, a subtraction effect is generated, thus greatly improving the output amplitude of signals thereof. In FIG. 10, two adjacent interlocked gaps have opposite features. Therefore, if the two are placed in the same push arm or pull arm and are connected in series, a cancellation effect will be generated. Meanwhile, considering the two push arms and the two pull arms of the full-bridge structure as well as the Hx magnetic field distributions of interlocked gaps and non-interlocked gaps that are symmetric with respect to G0, the magnetoresistive sensing units of the push arms and the pull arms as well as a connection manner thereof may be determined in the following manners:

when K is an odd number, odd push arm sets A11 and A12 are defined as follows:

A11=[1, 2, 3, . . . , n1)], A12=[−1, −2, −3, . . . , −n1)]

wherein the odd push arm sets A11 and A12 correspond to the push magnetoresistive sensing unit strings;

odd pull arm sets A21 and A22 are defined as follows:

A21=[1.5, 2.5, 3.5, . . . , n1+0.5], A22=[−1.5, −2.5, −3.5, . . . , −(n1+0.5)];

wherein the odd pull arm sets A21 and A22 correspond to the pull magnetoresistive sensing unit strings;

when K is an even number, even push arm sets B11 and B12 are defined as follows:

B11=[1, 2, 3, . . . , n2], B12=[−1, −2, −3, . . . , −n2];

wherein the even push arm sets B11 and B12 correspond to the push magnetoresistive sensing unit strings;

and even pull arm sets B21 and B22 are defined as follows:

B21=[0.5, 1.5, 2.5, . . . , n2+0.5], B22=[−0.5, −1.5, −2.5, −(n2+0.5)]

wherein the even pull arm sets B21 and B22 correspond to the pull magnetoresistive sensing unit strings.

The actual magnetoresistive sensing unit strings of the push arms and the pull arms may be connected in the following manners:

Assuming that there are multiple gap columns in the X direction, for the $J^{th}$ gap column, push arm sets thereof are A11(J) and 11(J) from which nJ (nJ is an integer greater than or equal to 1) elements such as $a_{1J}, a_{2J}, a_{3J}, \ldots, a_{nJ}$ are selected, wherein a difference between two adjacent elements is greater than 2. There exists $a_{11J}=a_{1J}\pm 1, a_{21J}=a_{2J}\pm 1, a_{31J}=a_{3J}\pm 1, \ldots, a_{n1J}=a_{nJ}\pm 1$, thus forming the Push(J) sets $[a_{1J}, a_{11J}, a_{2J}, a_{21J}, a_{3J}, a_{31J}, \ldots, a_{nJ}, a_{n1J}]$ and $[-a_{1J}, -a_{11J}, -a_{2J}, -a_{22J}, -a_{3J}, -a_{31J}, \ldots, a_{nJ}, -a_{n1J}]$, and there exists $a_{10J}=a_{1J}\pm 0.5, a_{110J}=a_{11J}\pm 0.5, a_{20J}=a_{2J}\pm 0.5, a_{210J}=a_{21J}\pm 0.5, a_{30J}=a_{3J}\pm 0.5, a_{310J}=a_{31J}\pm 0.5, \ldots, a_{n0J}=a_{nJ}\pm 0.5, a_{n10J}=a_{n1J}\pm 0.5$, forming the Pull(J) sets $[a_{10J}, a_{110J}, a_{20J}, a_{210J}, a_{30J}, a_{310J}, \ldots, a_{n0J}, a_{n10J}]$ and $[-a_{10J}, -a_{110J}, -a_{20J}, -a_{210J}, -a_{30J}, -a_{310J}, \ldots, -a_{n0J}, -a_{n10J}]$. For the push-pull X-axis magnetoresistive sensor in the type of the interlocked array of U-shaped soft ferromagnetic flux concentrators merely having a single gap column, a push arm thereof is a serial connection between the push magnetoresistive sensing unit strings corresponding to the Pull(J) sets, and the pull arm is a serial connection between the pull magnetoresistive sensing unit strings corresponding to the Pull(J) sets.

Figure 11:
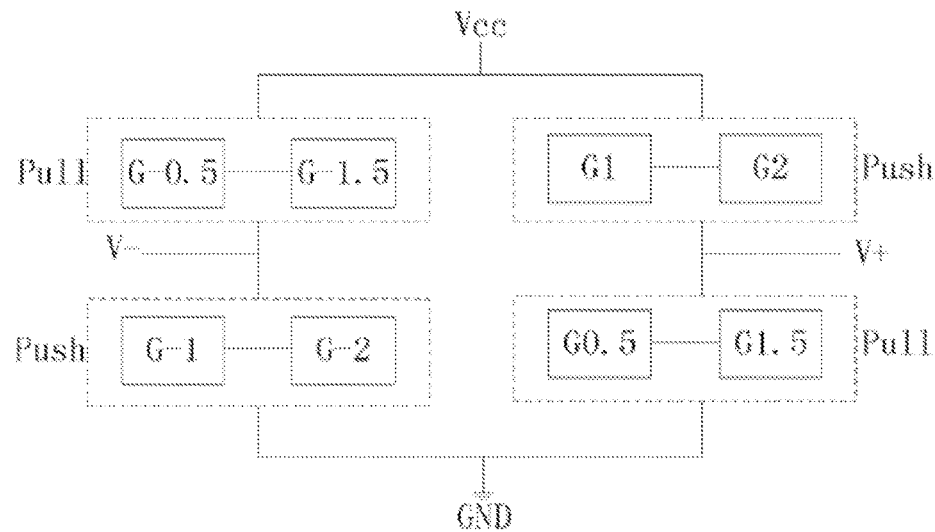
FIG. 11 is a first connection diagram of interlocked gaps and non-interlocked gaps in an interlocked full-bridge structure of U-shaped soft ferromagnetic flux concentrators.
Figure 12:
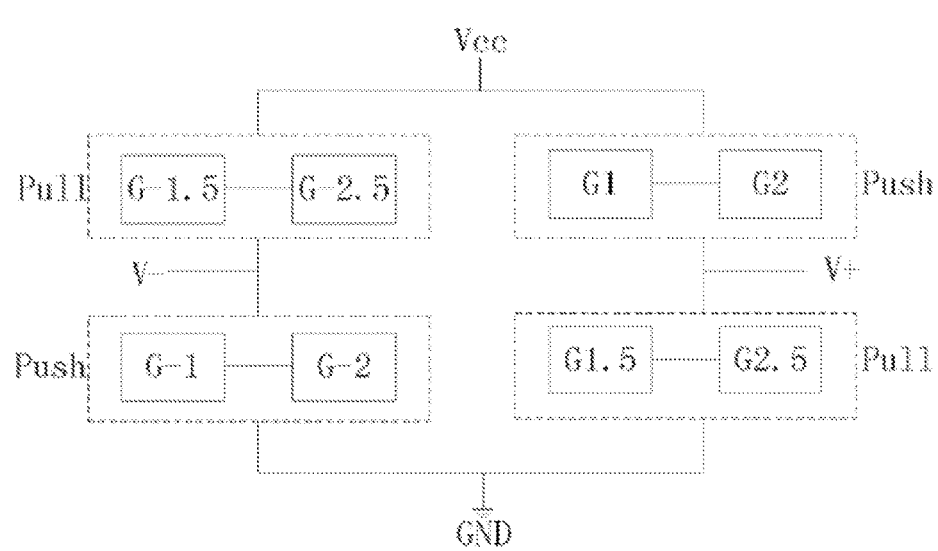
FIG. 12 is a second connection diagram of interlocked gaps and non-interlocked gaps in an interlocked full-bridge structure of U-shaped soft ferromagnetic flux concentrators.

Therefore, for the interlocked array of U-shaped soft ferromagnetic flux concentrators shown in FIG. 6, K=6 is an even number, and then:

an even gap set is [G−2.5, −G2, −G1.5, −G1, −G0.5, G0, G0.5, G1, G1.5, G2, G2.5];

even interlocked gaps are [−G2, −G1, G1, G2];

even non-interlocked gaps are [G−2.5, −G1.5, −G0.5, G0.5, G1.5, G2.5];

even push arm sets are [G1, G2] and [−G2, −G1];

even pull arm sets are [G0.5, G1.5, G2.5] and [G−2.5, −G1.5, −G0.5]; and the push arms Push and pull arms Pull of the push-pull X-axis magnetoresistive sensor and a full-bridge connection thereof are as shown in FIG. 11 and FIG. 12. In FIG. 11, the push arms Push are respectively serial connections between the elements G1 and G2 and between the elements G−1 and G−2 in the push arm sets, and the pull arms Pull are respectively serial connections between the elements G0.5 and G1.5 and between the elements G−0.5 and G−1.5 in the pull arm sets. In FIG. 12, the push arms Push are kept unchanged, and the pull arms Pull are respectively serial connections between the elements G1.5 and G2.5 and between the elements G−1.5 and G−2.5 in the pull arm sets.

What described above is a full-bridge connection manner, and in fact, a half-bridge or a quasi-bridge structure may also be formed.

Embodiment 3

For an interlocked array of soft ferromagnetic flux concentrators having multiple gap columns and formed by H-shaped soft ferromagnetic flux concentrators or formed by U-shaped and H-shaped soft ferromagnetic flux concentrators, assuming that M gap columns are present along the X direction, for the $J^{th}$ column, there is one of the odd or even push arm sets A11(J) or B11(J), (J is an integer from 1 to M). Therefore, a set of the numbers of elements selected from each column in the M columns is [J1, J2, J3, . . . , JM] (J1, J2, . . . , JM are all integers greater than or equal to 1). Likewise, there exists a Pull column set {Pull(1), Pull(2), Pull(3), . . . , Pull(M)} and a Push column set {Push(1), Push(2), Push(3), . . . , Push(M)} correspondingly. The push arm Push of the final push-pull X-axis magnetoresistive sensor is a serial connection between the push magnetoresistive sensing unit strings corresponding to the Push(J) sets corresponding to the J columns, and the pull arm Pull is a serial connection between the pull magnetoresistive sensing unit strings corresponding to the Pull(J) sets corresponding to the J columns.

Figure 13:
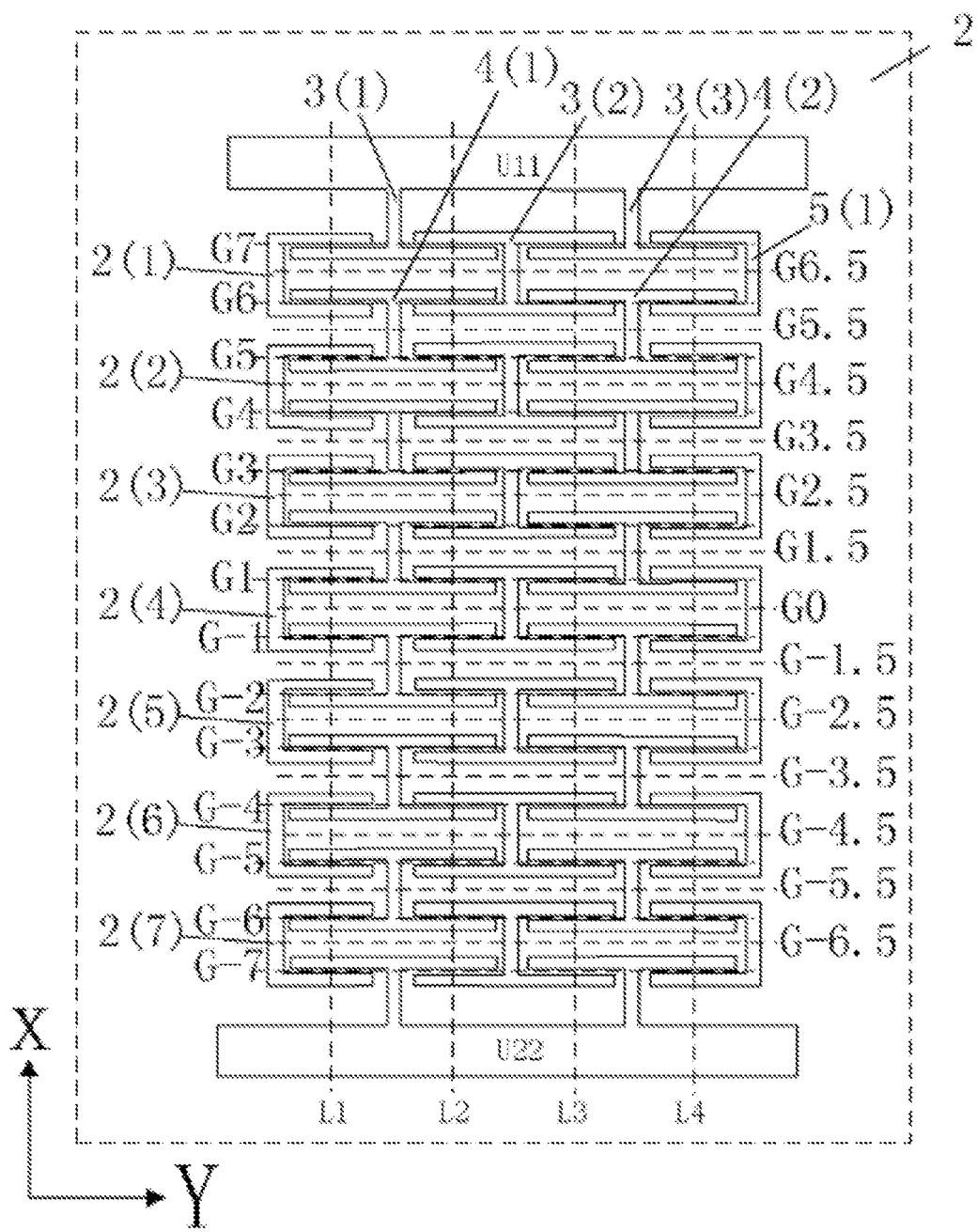
FIG. 13 is a structural diagram of an interlocked hybrid array of U-shaped and H-shaped soft ferromagnetic flux concentrators.

FIG. 13 shows a second type of structure of a push-pull X-axis magnetoresistive sensor according to the present invention, i.e., an interlocked array 2 of U-shaped and H-shaped hybrid soft ferromagnetic flux concentrators, including the leftmost U-shaped soft ferromagnetic flux concentrator column, the rightmost U-shaped soft ferromagnetic flux concentrator column and three columns of H-shaped soft ferromagnetic flux concentrators in the middle along the X direction. The leftmost U-shaped soft ferromagnetic flux concentrator column is formed by totally N U-shaped soft ferromagnetic flux concentrators 2(1), 2(2), . . . , 2(N). The rightmost U-shaped soft ferromagnetic flux concentrator column is formed by totally N U-shaped soft ferromagnetic flux concentrators 5(1), 5(2), . . . , 5(N). Among the three columns of H-shaped soft ferromagnetic flux concentrators in the middle, the first column is formed by N+1 H-shaped soft ferromagnetic flux concentrators, the second column is formed by N H-shaped soft ferromagnetic flux concentrators, and the third column is formed by N+1 H-shaped soft ferromagnetic flux concentrators. In each column, adjacent two U-shaped soft ferromagnetic flux concentrators such as 2(1) and 2(2) form an interlocking structure with an H-shaped soft ferromagnetic flux concentrator such as 4(1). Along the Y direction, in the leftmost array of the U-shaped soft ferromagnetic flux concentrators, any U-shaped soft ferromagnetic flux concentrator such as 2(1) forms an interlocking structure with two adjacent H-shaped soft ferromagnetic flux concentrators such as 3(1) and 4(1). Then, the two H-shaped soft ferromagnetic flux concentrators 3(1) and 4(1) form an interlocking structure respectively with a common adjacent H-shaped soft ferromagnetic flux concentrator 3(2), and the H-shaped soft ferromagnetic flux concentrator 3(2) forms an interlocking structure with two adjacent H-shaped soft ferromagnetic flux concentrators 3(3) and 4(2), respectively. That two H-shaped soft ferromagnetic flux concentrators and the same H-shaped soft ferromagnetic flux concentrator form an interlocking structure at the same gap Hg1 or Hg2 occurs alternatively. Finally, at left and right ends, two H-shaped soft ferromagnetic flux concentrators 3(1), 4(1) and one U-shaped soft ferromagnetic flux concentrator 2(1), or 3(3), 4(2) and 5(1) form an interlocking structure. That is, for the Y direction, the middle part is a connection formed by multiple interlocking structures including two H-shaped soft ferromagnetic flux concentrators and one H-shaped soft ferromagnetic flux concentrator, and two ends correspond to the U-shaped soft ferromagnetic flux concentrator. Moreover, bars U1 of all the H-shaped soft ferromagnetic flux concentrators, such as 3(1) and 3(3), located at the upmost ends in the X direction are combined into an end bar Ulf. Likewise, bars U2 of all the H-shaped soft ferromagnetic flux concentrators located at the lowermost ends in the X direction are combined into the other end bar U22. In the Y direction, the two end bars span all the H-shaped or U-shaped soft ferromagnetic flux concentrators in the Y direction.

The interlocked array 2 of U-shaped and H-shaped hybrid soft ferromagnetic flux concentrators forms an M*N gap array, as shown in FIG. 13, there are totally L1, L2, L3 and L4 gap columns, wherein each column includes interlocked gaps and non-interlocked gaps arranged alternately, and each column has the same arrangement sequence of interlocked gaps and non-interlocked gaps.

Likewise, for all gaps of each column, a middle gap is defined as G0, and using this as an origin, gaps in the positive X direction are sequentially G1, G1.5, G2, G2.5, G3, G3.5, G4, G4.5, G5, G5.5, G6, G6.5, G7, and gaps in the negative X direction are sequentially G−1, G−1.5, G−2, G−2.5, G−3, G−3.5, G−4, G−4.5, G−5, G−5.5, G−6, G−6.5, G−7.

Figure 14:
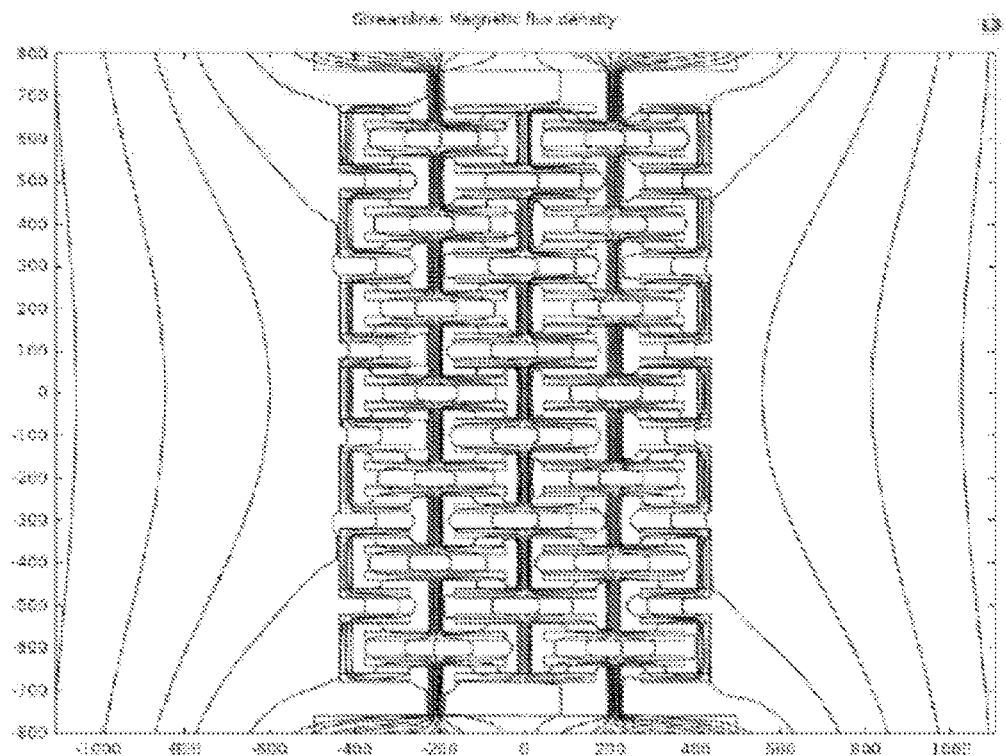
FIG. 14 is a distribution diagram of magnetic force lines of an interlocked hybrid array structure of U-shaped and H-shaped soft ferromagnetic flux concentrators in an external X magnetic field.
Figure 15:
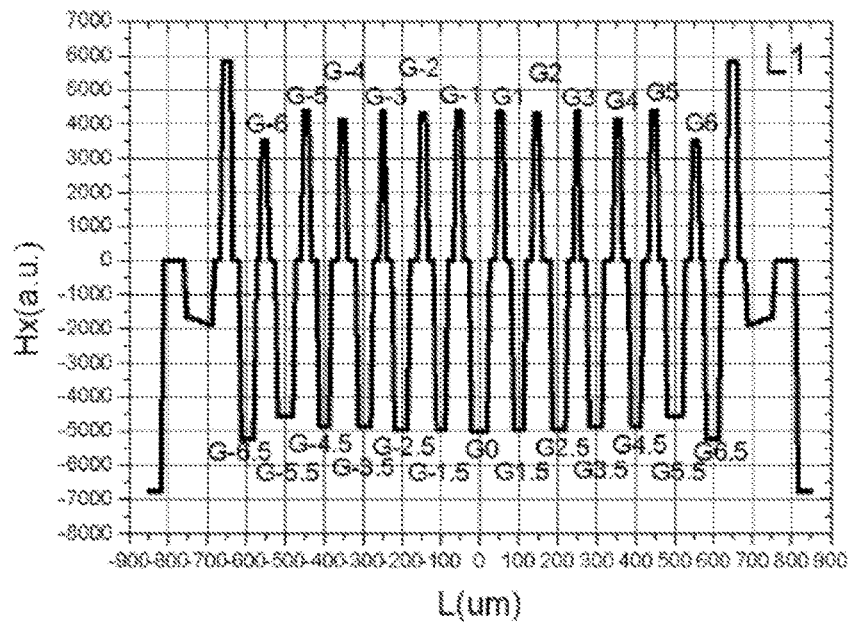
FIG. 15 is a distribution diagram of Hx magnetic field components at gap columns in the external X magnetic field.

FIG. 14 shows magnetic force line features of an interlocked array 2 of U-shaped and H-shaped hybrid soft ferromagnetic flux concentrators under the effect of an X direction external magnetic field. It can be seen that, magnetic field components at interlocked gaps and non-interlocked gaps have X distribution features, and the distribution of Hx magnetic field components at the L1 gap column is as shown in FIG. 15. It can be seen that Hx magnetic fields of all the gaps are symmetric with respect to the middle gap G0, and adjacent two gaps have magnetic fields in opposite directions and approximate amplitude values.

Figure 16:
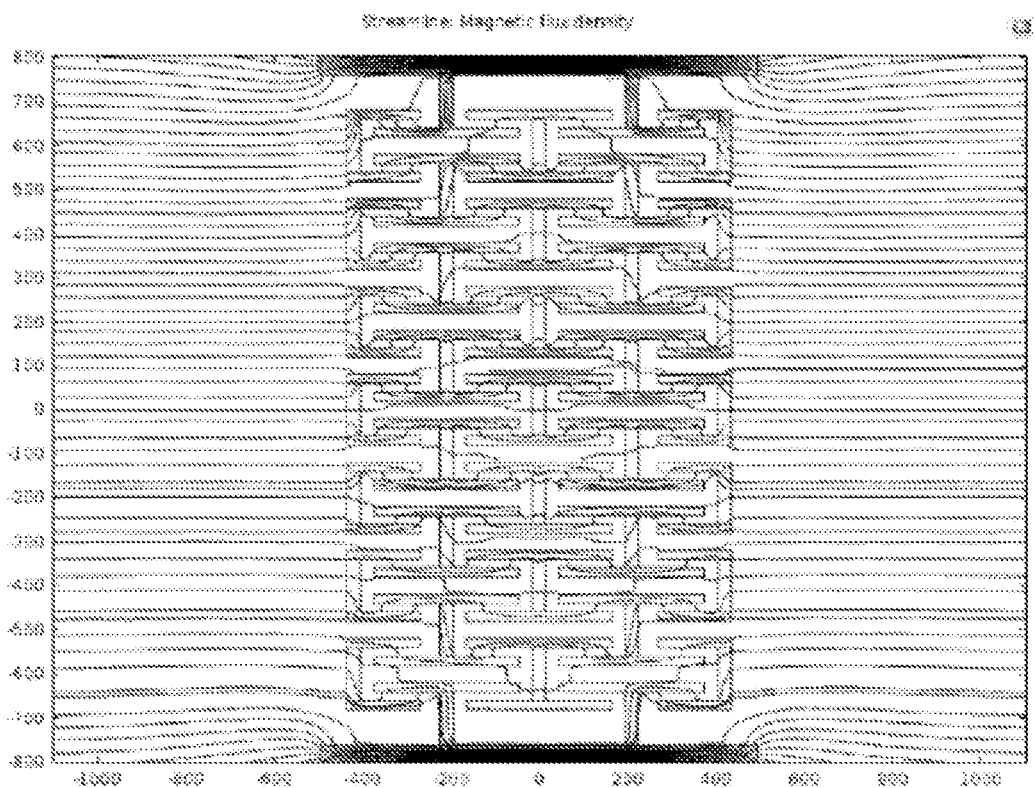
FIG. 16 is a distribution diagram of magnetic force lines of an interlocked hybrid array structure of U-shaped and H-shaped soft ferromagnetic flux concentrators in an external Y magnetic field.
Figure 17:
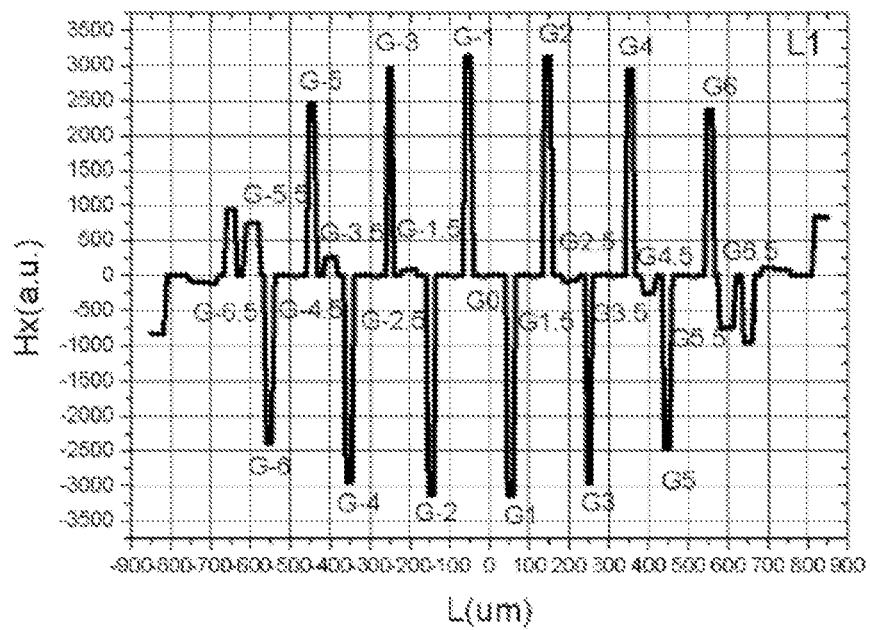
FIG. 17 is a distribution diagram of Hx magnetic field components at gap columns in the external Y magnetic field.

FIG. 16 shows magnetic force line features of an interlocked array 2 of U-shaped and H-shaped hybrid soft ferromagnetic flux concentrators under the effect of a Y direction external magnetic field. It can be seen that, magnetic field components at all interlocked gaps have X distribution features. At non-interlocked gaps, few magnetic force lines are distributed, and the surface magnetic field intensity thereof is less than the amplitude at the interlocked gaps. The distribution of Hx magnetic field components at the L1 gap column is as shown in FIG. 17. It can be seen that gap magnetic field components Hx have antisymmetric distribution features with respect to G0, where Hx magnetic field components have large amplitudes at the interlocked gaps, have amplitudes approximate to 0 at the first type of non-interlocked gaps, and have certain amplitudes at the second type of non-interlocked gaps, much less than the amplitudes at the interlocked gaps.

Figure 18:
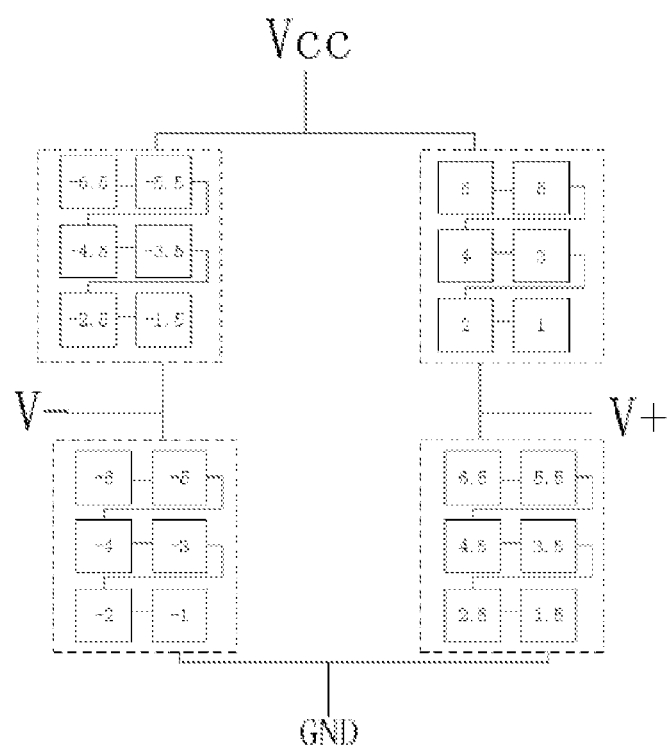
FIG. 18 is a connection diagram of interlocked gaps and non-interlocked gaps in an interlocked full-bridge hybrid structure of U-shaped and H-shaped soft ferromagnetic flux concentrators.

A set of all gaps is [G–6.5, G–6, . . . , G–1.5, G–1, G0, G1, G1.5, . . . , G6, G6.5];

an interlocked gap set is [G–6, G–5, G–4, G–3, G–2, G–1, G1, G2, G3, G4, G5, G6];

a non-interlocked gap set is:
[G–6.5, G–5.5, G–4.5, G–3.5, G–2.5, G–1.5, G1.5, G2.5, G3.5, G4.5, G5.5, G6.5];

a push arm set is [G1, G2, G3, G4, G5, G6] or [G–1, G–2, G–3, G–4, G–5, G–6];

a pull arm set is:
[G6.5, G5.5, G4.5, G3.5, G2.5, G1.5] or [G–6.5, G–5.5, G–4.5, G–3.5, G–2.5, G–1.5];

when a full-bridge structure of a push-pull X-axis magnetoresistive sensor is formed, a connection structural diagram thereof is as shown in FIG. 18, wherein push arms Push are respectively a serial connection of push arm set units G1, G2, G3, G4, G5, G6 and a serial connection of G–1, G–2, G–3, G–4, G–5, G–6; and pull arms Pull are respectively a serial connection of pull arm set units G1.5, G2.5, G3.5, G4.5, G5.5, G6.5 and a serial connection of G–1.5, G–2.5, G–3.5, G–4.5, G–5.5, G–6.5.

The third type of structure of the push-pull X-axis magnetoresistive sensor according to the present invention, i.e., the interlocked array of H-shaped soft ferromagnetic flux concentrators, is on the basis of the second type of structure of the push-pull X-axis magnetoresistive sensor, wherein the leftmost and the rightmost U-shaped soft ferromagnetic flux concentrators are replaced with H-shaped soft ferromagnetic flux concentrators.

Embodiment 4

Figure 19:
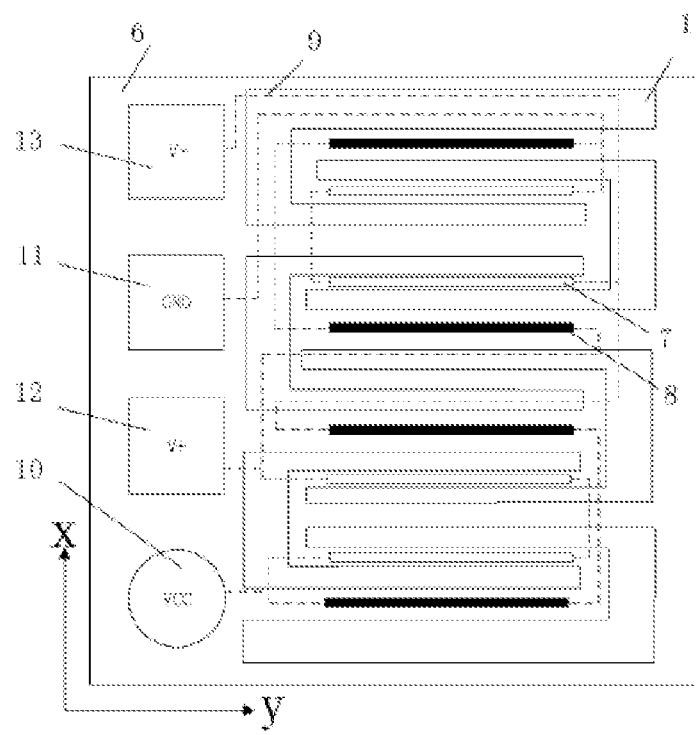
FIG. 19 is a structural diagram of a full-bridge push-pull X-axis magnetoresistive sensor in an interlocked array of U-shaped soft ferromagnetic flux concentrators.

FIG. 19 is a structural diagram of a push-pull X-axis magnetoresistive sensor based on a first magnetic circuit structure, i.e., an interlocked array 1 of U-shaped soft ferromagnetic flux concentrators according to the present invention, including a substrate 6, an interlocked array 1 of U-shaped soft ferromagnetic flux concentrators located on the substrate, push magnetoresistive sensing unit strings 7 located in interlocked gaps, and pull magnetoresistive sensing unit strings 8 located in non-interlocked gaps. The magnetoresistive sensing unit string includes multiple interconnected magnetoresistive sensing units, and the magnetoresistive sensing unit string is sensitive to magnetic field along the X direction, wherein 9 denotes a connection conductor between the magnetoresistive sensing unit strings, 10 denotes a Vcc electrode, 11 denotes a GND electrode, 12 denotes a V+ output electrode, and 13 denotes a V– output electrode. The connection is a push-pull full-bridge connection, and the push arm and the pull arm have identical magnetoresistive sensing unit resistances.

Figure 20:
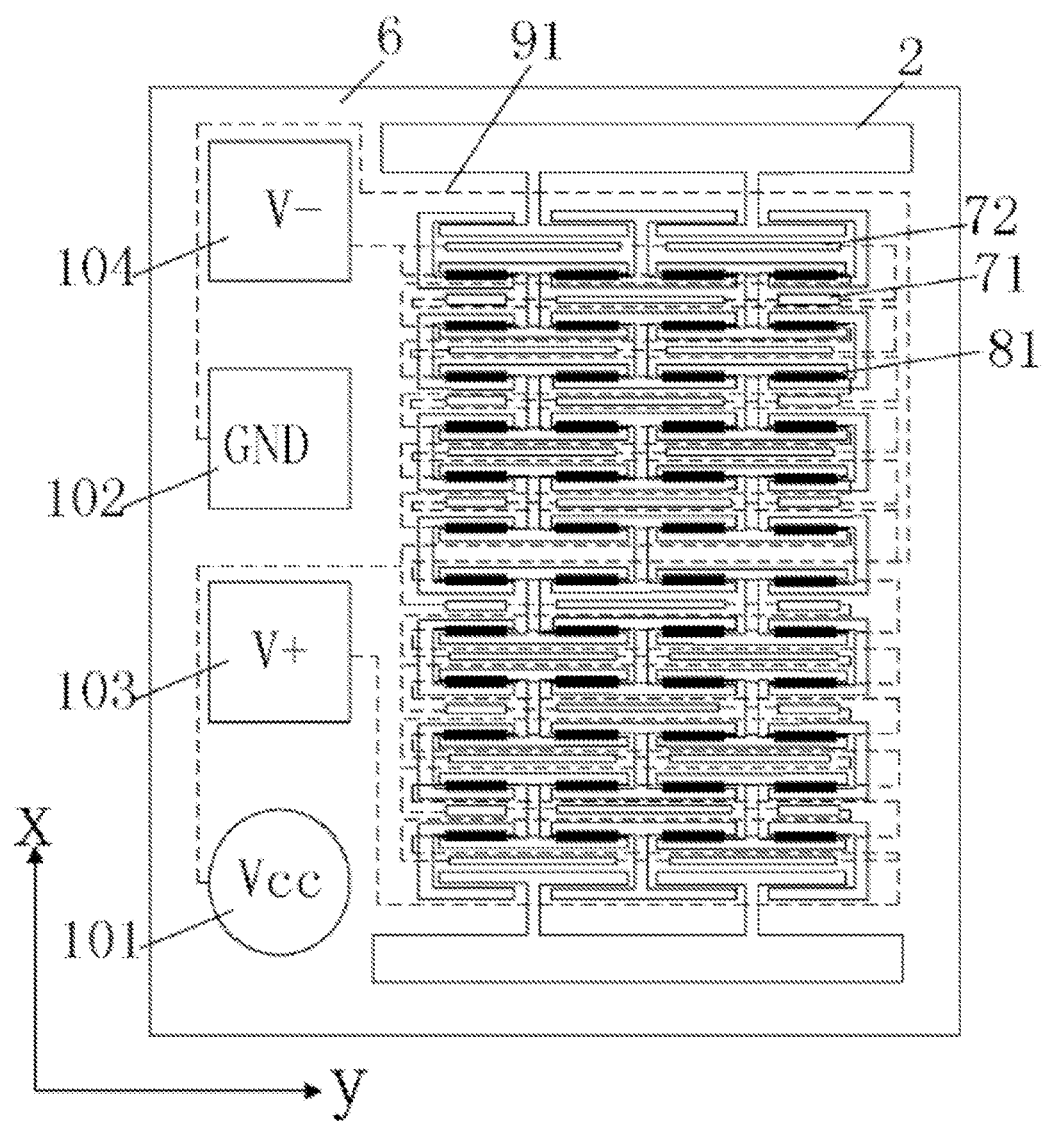
FIG. 20 is a structural diagram of a full-bridge push-pull X-axis magnetoresistive sensor in an interlocked hybrid array of U-shaped and H-shaped soft ferromagnetic flux concentrators.

FIG. 20 is a structural diagram of a push-pull X-axis magnetoresistive sensor based on a second magnetic circuit structure, i.e., an interlocked array 2 of U-shaped and H-shaped hybrid soft ferromagnetic flux concentrators according to the present invention, including a substrate 6, an interlocked array 2 of U-shaped and H-shaped hybrid soft ferromagnetic flux concentrators located on the substrate, push magnetoresistive sensing unit strings 81 located in interlocked gaps, and pull magnetoresistive sensing unit strings 72 and 71 located in non-interlocked gaps. 72 is located at the non-interlocked gap formed by two H-shaped soft ferromagnetic flux concentrators, is a single ferromagnetic sensing unit string formed by connecting two magnetoresistive sensing unit strings 71 in series, and has a resistance twice that of the magnetoresistive sensing unit string 71. In this embodiment, among the gap columns, magnetoresistive sensing unit strings of the same row along the Y direction are connected in series to form a string, and the strings are electrically connected to form a push-pull full-bridge structure, wherein 91 denotes a connection conductor between the magnetoresistive strings, 101 denotes a Vcc electrode, 102 denotes a GND electrode, 103 denotes a V+ output signal electrode, and 104 denotes a V– output signal electrode.

Embodiment 5

Figure 21:
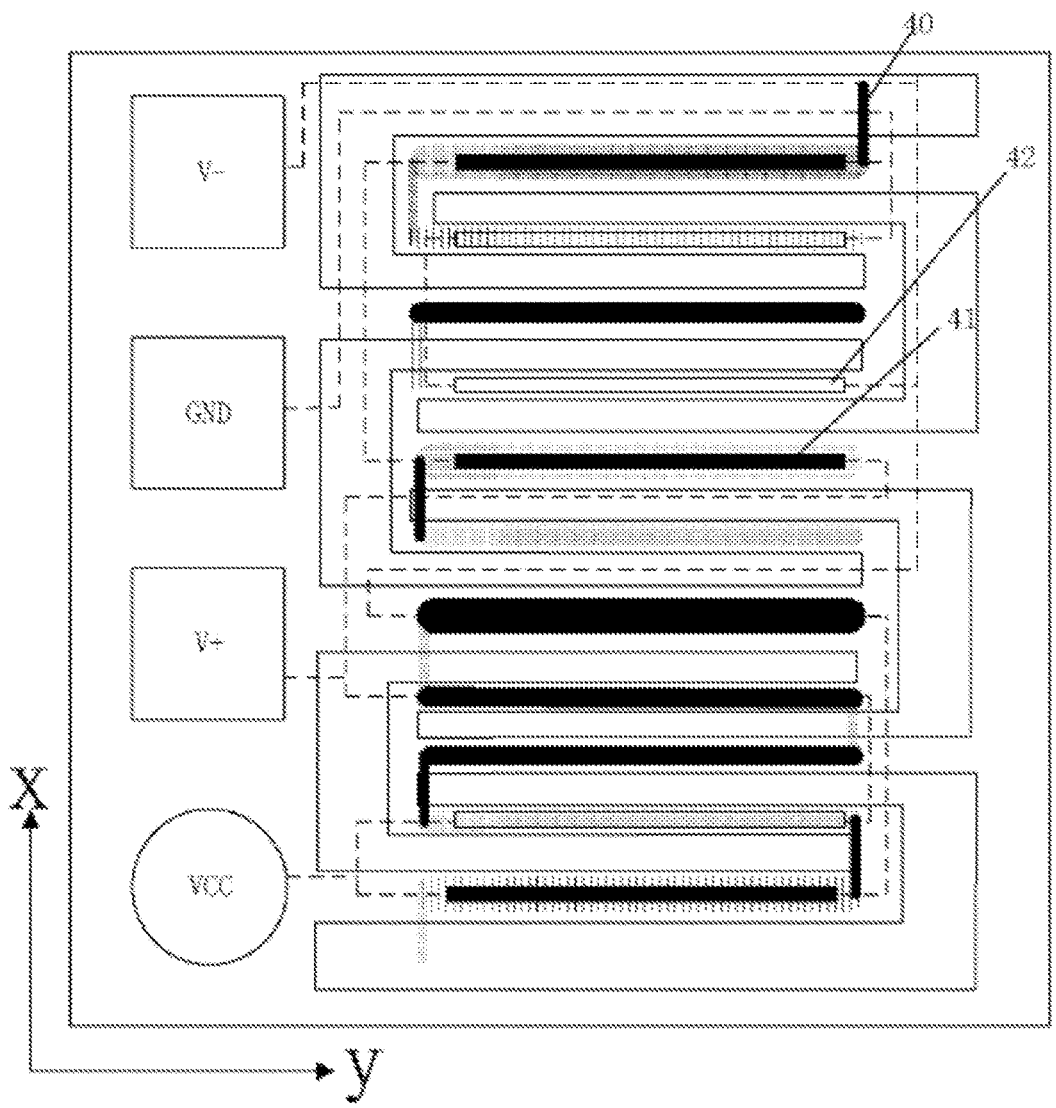
FIG. 21 is a structural diagram of an interlocked U-shaped push-pull X-axis magnetoresistive sensor including a calibration coil.

FIG. 21 is a structural diagram of a calibration coil 40 of a push-pull X-axis magnetoresistive sensor based on an interlocked array of U-shaped soft ferromagnetic flux concentrators. The calibration coil 40 includes push straight calibration conductors 42 and pull straight calibration conductors 41. The push straight calibration conductors 42 and the pull straight calibration conductors 41 are respectively located directly above or directly below push magnetoresistive sensing unit strings and pull magnetoresistive sensing unit strings. The push straight calibration conductors 42 and the pull straight calibration conductors 41 are connected in series and have opposite current directions. Moreover, the width of the push straight calibration conductor 42 is less than the width of the pull straight calibration conductor 41, this is because the width of the interlocked gap is less than the width of the non-interlocked gap, and the soft ferromagnetic flux concentrator at the interlocked gap has an enhancement effect greater than that at the non-interlocked gap. Therefore, the magnetic field at the non-interlocked gaps is enhanced by using the method of reducing the width of the straight conductor, such that the push magnetoresistive sensing unit string and the pull magnetoresistive sensing unit string have calibration magnetic fields in identical sizes and opposite directions.

Figure 22:
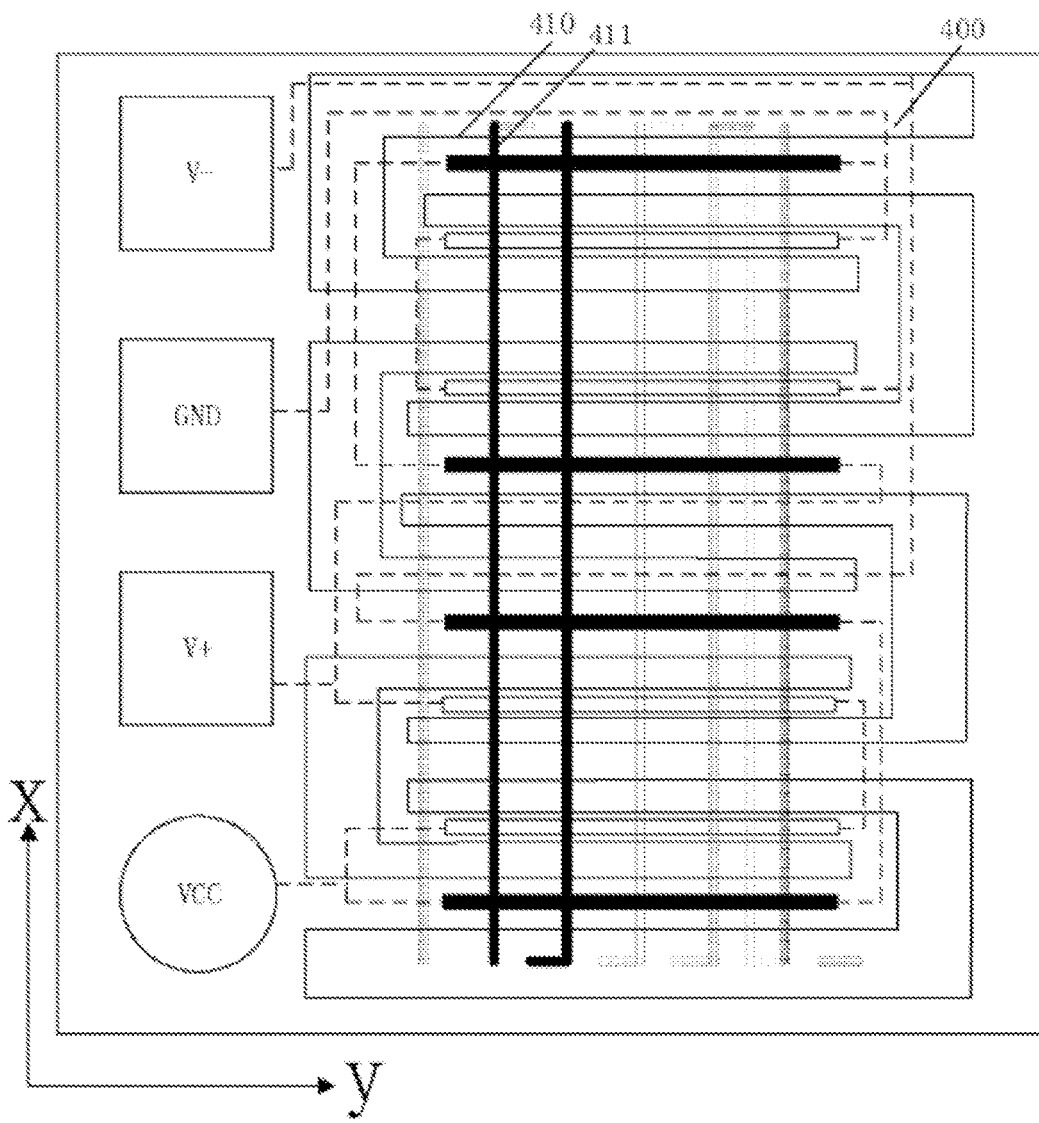
FIG. 22 is a structural diagram of an interlocked U-shaped push-pull X-axis magnetoresistive sensor including an initialization coil.

FIG. 22 is a structural diagram of a straight initialization conductor 400 of a push-pull X-axis magnetoresistive sensor based on an interlocked array of U-shaped soft ferromagnetic flux concentrators. The straight initialization conductor 400 includes straight initialization conductors 411. The straight initialization conductors 411 run perpendicular to the magnetoresistive sensing unit strings, and are located directly above or directly below magnetoresistive sensing units in the magnetoresistive sensing unit strings. All the straight initialization conductors are connected in series, and have identical initialization current directions. The straight conductor 411 is connected to two adjacent straight initialization conductors, and is located at a gap between two adjacent magnetoresistive sensing units.

Embodiment 6

Figure 23:
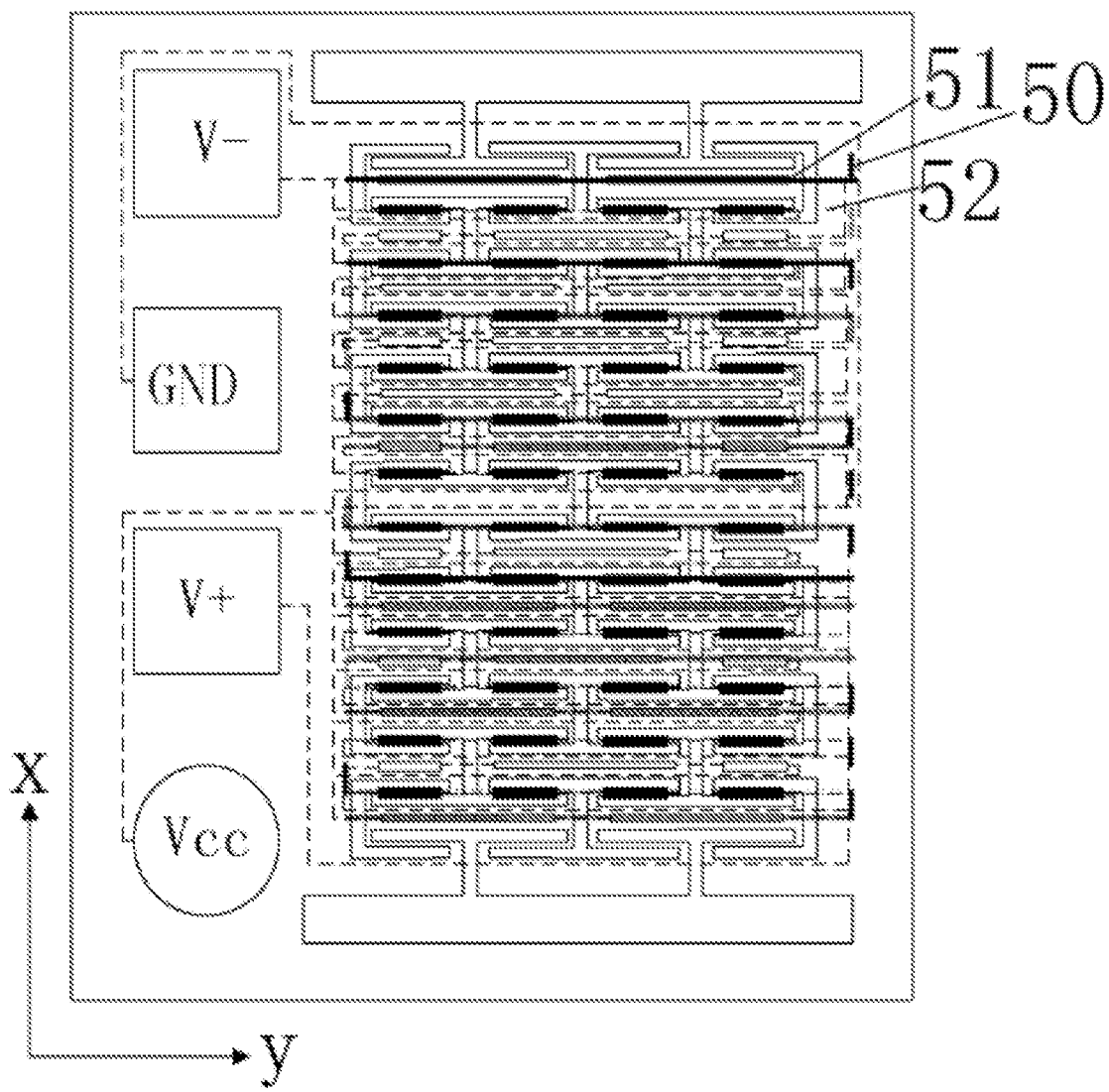
FIG. 23 is a structural diagram of an interlocked U-shaped and H-shaped hybrid push-pull X-axis magnetoresistive sensor including a calibration coil.

FIG. 23 is a structural diagram of a calibration coil 50 of a push-pull X-axis magnetoresistive sensor based on an interlocked array of U-shaped and H-shaped hybrid soft ferromagnetic flux concentrators, including push straight calibration conductors 52 and pull straight calibration conductors 51, respectively located directly above or directly below all push magnetoresistive sensing unit strings of the same row and all pull magnetoresistive sensing unit strings of the same row. The push straight calibration conductors 52 and the pull straight calibration conductors 51 are connected in series and have opposite current directions. The width of the push straight calibration conductor 52 is greater than the width of the pull straight calibration conductor, to compensate a difference of magnetic field enhancement effects from the soft ferromagnetic flux concentrator caused by that the width of the interlocked gap is less than the width of the non-interlocked gap. The push straight calibration conductors 52 and the pull straight calibration conductors 51 generate calibration magnetic fields in identical sizes and opposite directions respectively at the push magnetoresistive sensing unit strings and the pull magnetoresistive sensing unit strings.

Figure 24:
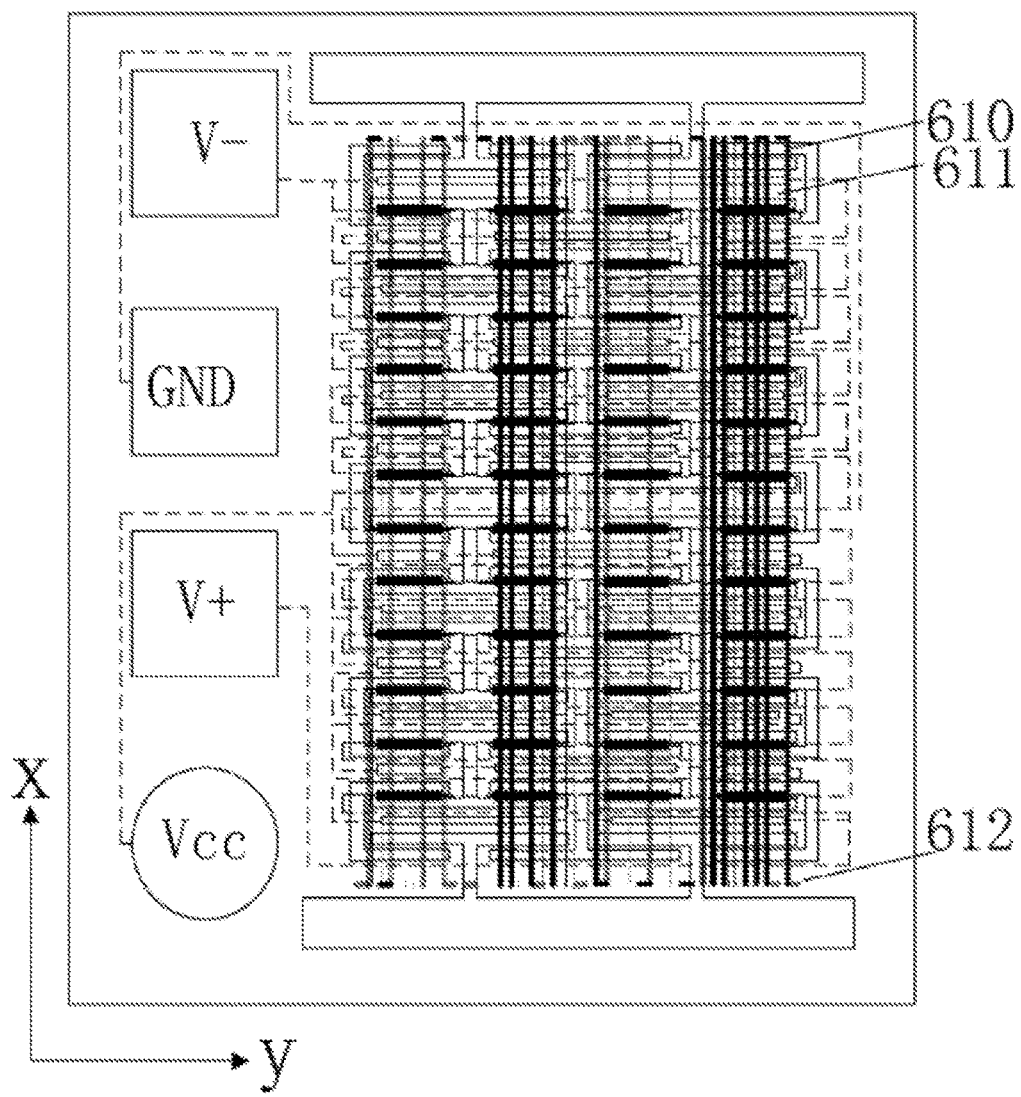
FIG. 24 is a structural diagram of an interlocked U-shaped and H-shaped hybrid push-pull X-axis magnetoresistive sensor including an initialization coil.

FIG. 24 is a structural diagram of an initialization coil 612 of a push-pull X-axis magnetoresistive sensor based on an interlocked array of U-shaped and H-shaped hybrid soft ferromagnetic flux concentrators, including straight initialization conductors 611 perpendicular to the magnetoresistive sensing unit strings. The straight initialization conductors 611 are located directly above or directly below magnetoresistive sensing units in the magnetoresistive sensing unit strings. All the straight initialization conductors are connected in series and have identical current directions, and are connected to one another by straight conductors 611, wherein the straight conductors 611 pass through gaps between the magnetoresistive sensing units or outer sides of edges of the magnetoresistive sensing units in the magnetoresistive sensing unit strings.

Embodiment 7

Figure 25:
FIG. 25 is a distribution diagram of magnetic force lines generated by a calibration coil on a section of interlocked gap columns.

FIG. 25 shows distribution of magnetic force lines generated by push straight calibration conductors and pull straight calibration conductors on single gap columns of two types of push-pull X-axis magnetoresistive sensors including an interlocked array of U-shaped soft ferromagnetic flux concentrators and an interlocked array of U-shaped and H-shaped hybrid soft ferromagnetic flux concentrators. It can be seen that, the push straight calibration conductors and pull straight calibration conductors have opposite current directions, and therefore, the magnetic force lines form magnetic force line loops with the push straight calibration conductors and the pull straight calibration conductors as centers.

Figure 26:
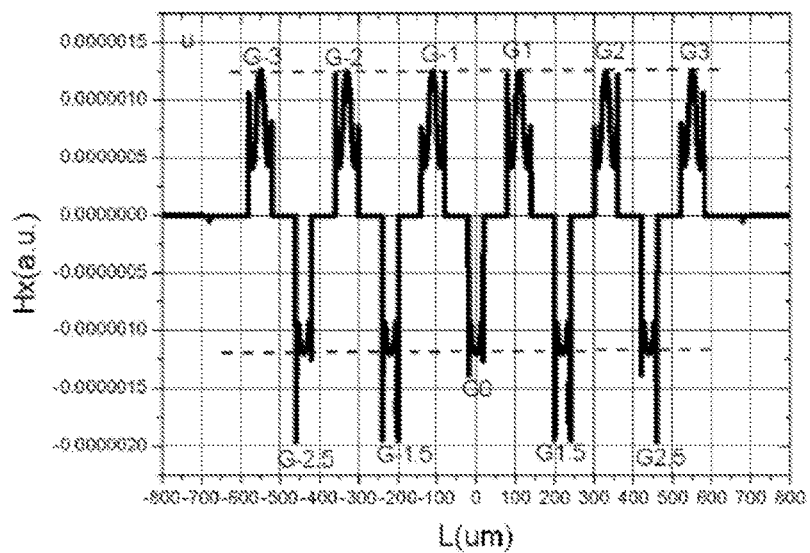
FIG. 26 is a distribution diagram of an Hx magnetic field at a magnetoresistive sensing unit string on a section of interlocked gap columns.

FIG. 26 is a distribution diagram of Hx magnetic fields at magnetoresistive sensing unit strings. It can be seen that, interlocked gaps G1, G2, G3, G-3, G-2, G-1 where push magnetoresistive sensing unit strings are located have Hx-direction magnetic fields in a direction opposite to that of Hx-direction magnetic fields of the non-interlocked gaps G-2.5, G-1.5, G1.5, G2.5 where pull magnetoresistive sensing unit strings are located, and the two magnetic fields have approximate amplitudes, meeting the requirement of a calibration magnetic field of the push-pull X-axis magnetoresistive sensor.

Figure 27:
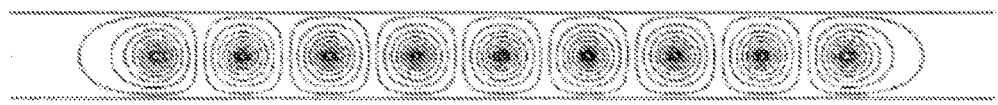
FIG. 27 is a distribution diagram of magnetic force lines generated by an initialization coil on a section perpendicular to a magnetoresistive sensing unit string.

FIG. 27 shows distribution of magnetic force lines generated by straight connection lines of a straight initialization conductor and two adjacent straight initialization conductors included by an initialization coil on a single magnetoresistive sensing unit string of each of two types of push-pull X-axis magnetoresistive sensors including an interlocked array of U-shaped soft ferromagnetic flux concentrators and an interlocked array of U-shaped and H-shaped hybrid soft ferromagnetic flux concentrators. It can be seen that the straight initialization conductors and the straight connection conductors have opposite current directions, and therefore, each straight conductor is correspondingly a center of a magnetic line force loop.

Figure 28:
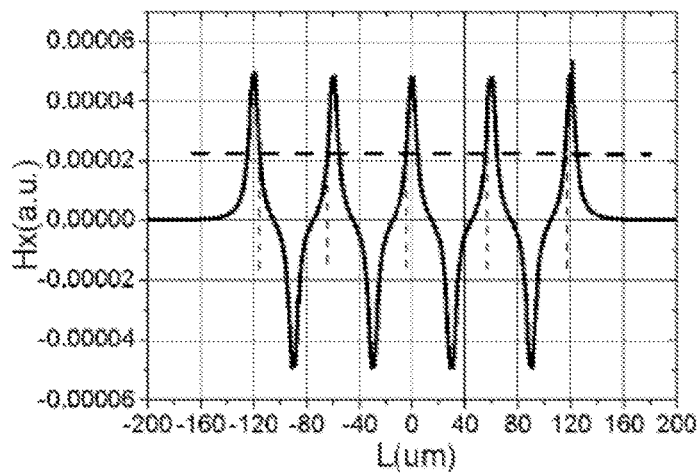
FIG. 28 is a distribution diagram of an Hx magnetic field at a magnetoresistive sensing unit string on a section perpendicular to a magnetoresistive sensing unit string.

FIG. 28 is a distribution diagram of Hx magnetic fields at magnetoresistive sensing unit strings. It can be seen that, at the magnetoresistive sensing unit strings, the Hx magnetic fields have features of periodic distribution. Therefore, when magnetoresistive sensing units are located directly above or directly below the straight initialization conductors, maximum magnetic fields are present. In this case, a connection conductor is located at a gap between two adjacent magnetoresistive sensing units.

Embodiment 8

Figure 29:
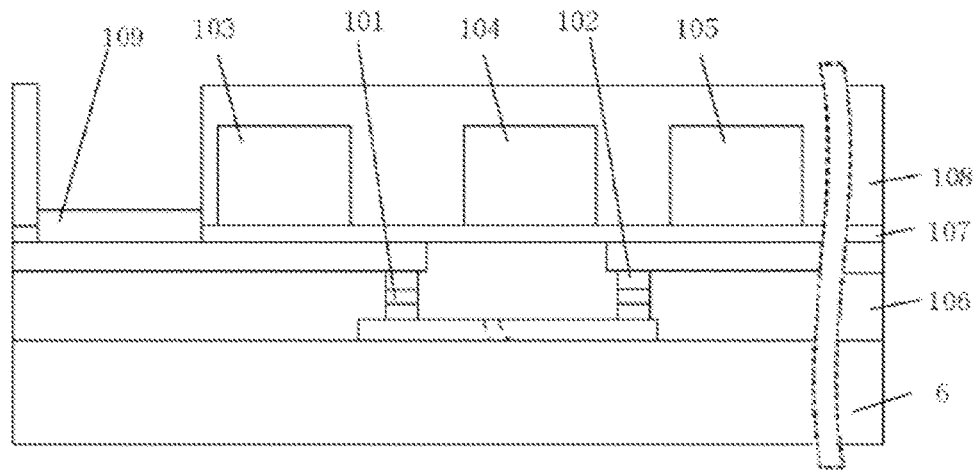
FIG. 29 is a structural diagram of a section of a push-pull X-axis magnetoresistive sensor.

FIG. 29 is a sectional structural diagram of two types of push-pull X-axis magnetoresistive sensors including an interlocked array of U-shaped soft ferromagnetic flux concentrators and an interlocked array of U-shaped and H-shaped hybrid soft ferromagnetic flux concentrators, wherein 6 denotes a substrate, 101 denotes a pull magnetoresistive sensing unit string located at a non-interlocked gap, 103 and 104 denote two non-interlocked bars between which the non-interlocked gap is formed, 102 denotes a push magnetoresistive sensing unit string located at an interlocked gap, 104 and 105 denote two interlocked bars between which the interlocked gap is formed, 106, 107 and 108 respectively denote insulating layers for electrical insulating and structural support between conductive layers, and 109 denotes an electrode.

Figure 30:
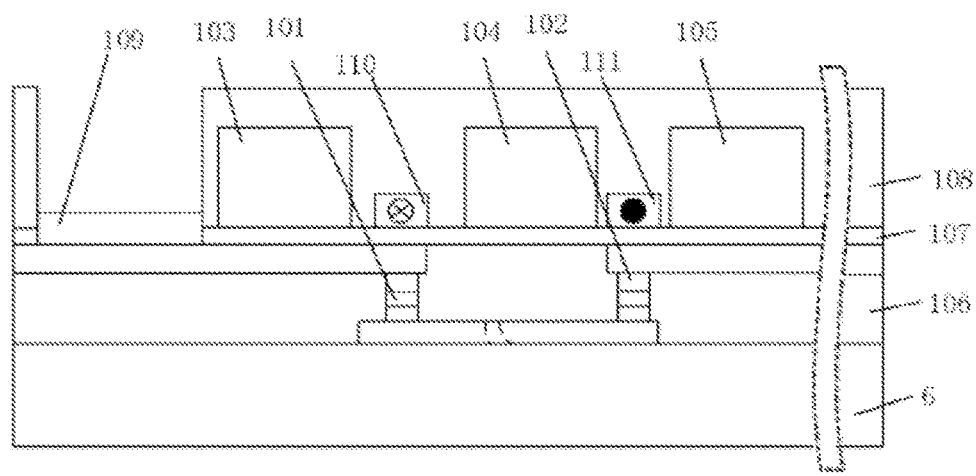
FIG. 30 is a structural diagram of a section of a push-pull X-axis magnetoresistive sensor including a calibration coil.

FIG. 30 is a sectional diagram of two types of push-pull X-axis magnetoresistive sensors including an interlocked array of U-shaped soft ferromagnetic flux concentrators or an interlocked array of U-shaped and H-shaped hybrid soft ferromagnetic flux concentrators that include a calibration coil. A push straight calibration conductor 111 and a pull straight calibration conductor 110 in the calibration coil are respectively located above a push magnetoresistive sensing unit string and a pull magnetoresistive sensing unit string, and in fact may be located between the magnetoresistive sensing unit and the soft ferromagnetic flux concentrator, or located between the substrate and the magnetoresistive sensing unit.

Figure 31:
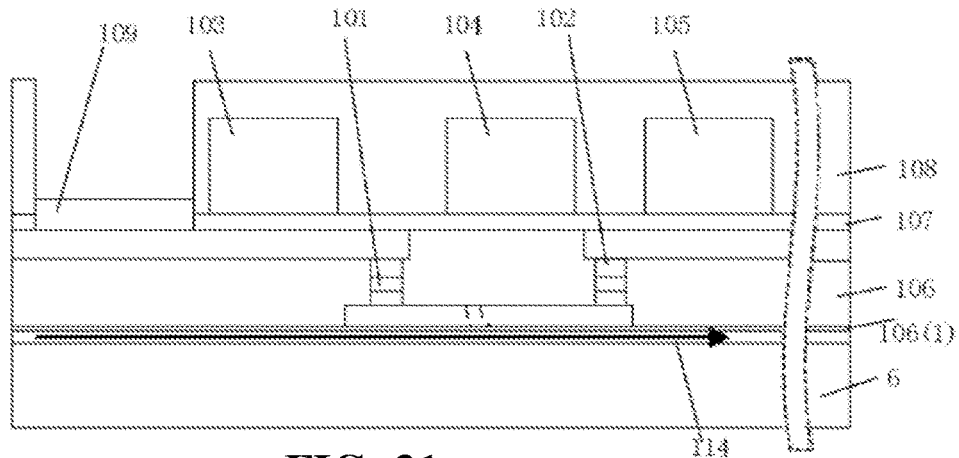
FIG. 31 is a structural diagram of a section of a push-pull X-axis magnetoresistive sensor including an initialization coil.

FIG. 31 is a sectional diagram of two types of push-pull X-axis magnetoresistive sensors including an interlocked array of U-shaped soft ferromagnetic flux concentrators or an interlocked array of U-shaped and H-shaped hybrid soft ferromagnetic flux concentrators that includes an initialization coil, wherein a straight calibration conductor 114 is perpendicular to a magnetoresistive sensing unit string. In the drawing, the calibration coil is located above the substrate, below the magnetoresistive sensing unit, and in fact may be located between the magnetoresistive sensing unit and the soft ferromagnetic flux concentrator, or located above the soft ferromagnetic flux concentrator.

Figure 32:
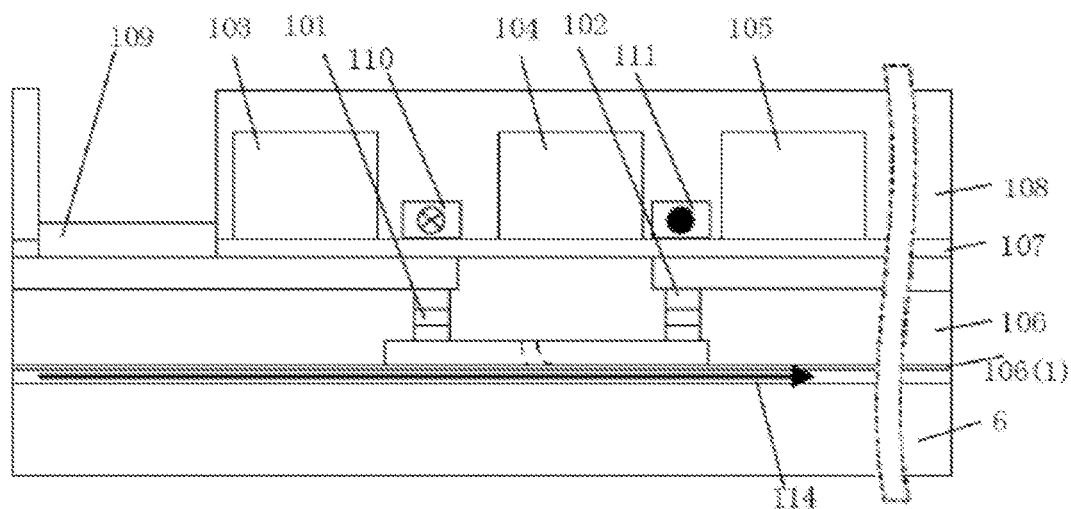
FIG. 32 is a structural diagram of a section of a push-pull X-axis magnetoresistive sensor including a calibration coil and an initialization coil.

FIG. 32 is a sectional diagram of two types of push-pull X-axis magnetoresistive sensors including an interlocked array of U-shaped soft ferromagnetic flux concentrators or an interlocked array of U-shaped and H-shaped hybrid soft ferromagnetic flux concentrators that include a calibration coil and an initialization coil, wherein 110 and 111 respectively denote a push straight calibration conductor and a pull straight calibration conductor located directly above the push magnetoresistive sensing unit string and the pull magnetoresistive sensing unit string respectively, and 114 denotes a straight initialization conductor located above the substrate and between the magnetoresistive sensing units. In fact, the calibration coil may also be located between the magnetoresistive sensing unit and the soft ferromagnetic flux concentrator, or between the substrate and the magnetoresistive sensing unit. The initialization coil may further be located between the magnetoresistive sensing unit and the soft ferromagnetic flux concentrator, or above the soft ferromagnetic flux concentrator.

The magnetoresistive sensing units are GMR spin valves or TMR sensing units, wherein the directions of pinning layers are parallel to the X-axis, and the directions of free layers are parallel to the Y-axis.

In the presence of an external magnetic field, the magnetoresistive sensing units make magnetization directions of magnetic free layers perpendicular to magnetization directions of magnetic pinning layers thereof by permanent magnet biasing, double exchange interaction, shape anisotropy or any combination thereof.

The push arm and the pull arm have the same quantity of magnetoresistive sensing units.

The calibration current may be set to one current value or multiple current values.

The initialization coil includes two ports, and when a current flows through the two ports, the magnitude of an initialization magnetic field generated thereby is higher than a saturated magnetic field value of the magnetoresistive sensing unit.

The initialization current may be a pulse current or a direct current.

The initialization coil and the calibration coil are made of a high-conductivity material, including Cu, Au, and Ag.

The soft ferromagnetic flux concentrator is made of an alloy soft ferromagnetic material that includes one or more elements of Fe, Ni, Co and the like.

The material of the substrate is glass or a silicon wafer, and the substrate includes an ASIC or the substrate is connected to another ASIC chip.

The initialization coil and/or the calibration coil are/is isolated from the interlocked U-shaped or/and H-shaped soft ferromagnetic flux guides and the push-pull magnetoresistive bridge sensing unit by using an insulating material, and the insulating material is $SiO_2$, $Al_2O_3$, $Si_3N_4$, polyimide, or photoresist.

The invention claimed is:

1. A push-pull X-axis magnetoresistive sensor, comprising:
   a substrate,
   an interlocked array of soft ferromagnetic flux concentrators; and
   a push-pull magnetoresistive bridge sensing unit placed on the substrate,
   wherein the interlocked array of soft ferromagnetic flux concentrators comprises at least two soft ferromagnetic flux concentrators, each of the soft ferromagnetic flux concentrators comprises a rectangular positive X-direction bar bar1, a negative X-direction bar bar2, and a magnetoresistive bridge-0, the bar bar1 and the bar bar2 have major axes parallel to a Y-axis direction and minor axes parallel to an X-axis direction, the magnetoresistive bridge-0 has a major axis parallel to the X-axis and a minor axis parallel to the Y-axis, two ends of the major axis are interconnected with the bar bar1 and the bar bar2 respectively, and the soft ferromagnetic flux concentrators form an interlocking structure, and form interlocked gaps GapX1 and non-interlocked gaps GapX2 along the X direction; and
   wherein the push-pull magnetoresistive bridge sensing unit comprises at least a push arm and a pull arm, the push arm comprises at least one push magnetoresistive sensing unit string, and the pull arm comprises at least one pull magnetoresistive sensing unit string, the push and pull magnetoresistive sensing unit strings both comprise multiple interconnected magnetoresistive sensing units, the push magnetoresistive sensing unit strings are located at the interlocked gaps GapX1, the pull magnetoresistive sensing unit strings are located at the non-interlocked gaps GapX2, and the magnetoresistive sensing unit is sensitive to magnetic field along the X direction.

2. The push-pull X-axis magnetoresistive sensor according to claim 1, further comprising calibration coils and/or initialization coils,
   wherein the calibration coils are comprised of push straight calibration conductors and pull straight calibration conductors that run parallel to the push and pull magnetoresistive sensing unit strings; and when a calibration current flows through the calibration coils, calibration magnetic field components having identical amplitudes along the X direction and the −X direction are generated respectively at the push magnetoresistive sensing unit strings and the pull magnetoresistive sensing unit strings; and
   wherein the initialization coils are comprised of straight initialization conductors that run perpendicular to the magnetoresistive sensing unit strings; and when an initialization current flows into the initialization coils, initialization magnetic field components having identical amplitudes along the Y direction are generated at all the magnetoresistive sensing units.

3. The push-pull X-axis magnetoresistive sensor according to claim 1,
   wherein the soft ferromagnetic flux concentrators are U-shaped or H-shaped, positive Y ends or negative Y ends of the bars bar1 and the bars bar2 of the U-shaped soft ferromagnetic flux concentrators are aligned and are connected to the magnetoresistive bridge-0, and U gaps are formed between the bars bar1 and the bars bar2; and
   wherein the magnetoresistive bridge-0s of the H-shaped soft ferromagnetic flux concentrators are connected to midpoints of the bars bar1 and the bars bar2, H gaps are formed between the bars bar1 and the bars bar2, and the H gaps are classified into positive H gaps and negative H gaps according to the Y-axis directions.

4. The push-pull X-axis magnetoresistive sensor according to claim 1,
   wherein the interlocked array of soft ferromagnetic flux concentrators is formed by the U-shaped soft ferromagnetic flux concentrators, or the H-shaped soft ferromagnetic flux concentrators, or the U-shaped soft ferromagnetic flux concentrators and the H-shaped soft ferromagnetic flux concentrators;

wherein one interlocked gap column is formed along the X direction;

wherein for any of the soft ferromagnetic flux concentrators, at least another of the soft ferromagnetic flux concentrators is present such that an interlocking structure may be formed; and wherein major axes of the positive X-direction bars bar1 and the negative X-direction bars bar2 span all the interlocked gaps in the Y direction.

5. The push-pull X-axis magnetoresistive sensor according to claim 1, wherein the interlocked array of soft ferromagnetic flux concentrators is formed by the U-shaped and H-shaped soft ferromagnetic flux concentrators, or is formed merely by the H-shaped soft ferromagnetic flux concentrators;

wherein an interlocked array of gaps having M rows and N columns is formed, wherein in the Y direction, the $1^{st}$ column and the $N^{th}$ column of the interlocked gaps are the interlocked gaps between the H-shaped and U-shaped soft ferromagnetic flux concentrators or the interlocking structure between the H-shaped soft ferromagnetic flux concentrators, and when N is an integer greater than or equal to 3, the $2^{nd}$ column to the $(N-1)^{th}$ column of the interlocked gaps in the middle all correspond to the interlocking structure between the H-shaped soft ferromagnetic flux concentrators; and wherein, in the X direction, each column comprises M interlocked gaps, wherein the positive X-direction bars bar1 of all the topmost soft ferromagnetic flux concentrators and the negative X-direction bars bar2 of all the bottommost soft ferromagnetic flux concentrators are combined into a D1 end bar and a D2 end bar, respectively, and major axes of the D1 and D2 end bars span all the interlocked gaps in the Y direction; M and N are integers greater than or equal to 2.

6. The push-pull X-axis magnetoresistive sensor according to claim 4, wherein when a total quantity K of the soft ferromagnetic flux concentrators in the interlocked gap column is an odd number, an odd gap set A formed by numerical labels of the interlocked gaps and the non-interlocked gaps is:

A=[−(n1+0.5), −n1, . . . , −1.5, −1, 0, 1, 1.5, . . . , n1, n1+0.5];

an odd interlocked gap set is: A1=[−n1, . . . , −1, 1, . . . , n1]; and an odd non-interlocked gap set is:

A2=[−(n1+0.5), . . . , −1.5, 1.5, . . . , n1+0.5]; and when the quantity K of the soft ferromagnetic flux concentrators is an even number, an even gap set B is:

B=[−(n2+0.5), −n2, . . . , −1, −0.5, 0, 0.5, 1, . . . , n2, (n2+0.5)];

an even interlocked gap set is: B1=[−n2; . . . , −1, 1, . . . , n2]; and an even non-interlocked gap set is: B2=[−n2−0.5, . . . , −0.5, 0.5, n2+0.5];

wherein 0 corresponds to a label of the middle gap, positive integers and positive fractions respectively correspond to labels of the interlocked gaps and non-interlocked gaps in the positive X direction, and negative integers and negative fractions respectively correspond to labels of the interlocked gaps and non-interlocked gaps in the negative X direction;

when K is an odd number, odd push arm sets are:

A11=[1, 2, 3, . . . , n1] and A12=[−1, −2, −3, . . . , −n1]

wherein the magnetoresistive sensing unit strings at the interlocked gaps form the push arm sets;

odd pull arm sets are:

A21=[1.5, 2.5, 3.5, . . . , n1+0.5] and A22=[−1.5, −2.5, −3.5, . . . , −(n1+0.5)];

wherein the magnetoresistive sensing unit strings at the non-interlocked gaps form the pull arm sets;

when K is an even number, even push arm sets are:

B11=[1, 2, 3, . . . , n2] and B12=[−1, −2, −3, . . . , −n2];

wherein the magnetoresistive sensing unit strings at the interlocked gaps form the push arm sets;

and even pull arm sets are:

B21=[0.5, 1.5, 2.5, . . . , (n2+0.5)] and B22=[−0.5, −1.5, −2.5, . . . , −(n2+0.5)];

wherein the magnetoresistive sensing unit strings at the non-interlocked gaps form the pull arm sets; and the n1=(K−1)/2, and the n2=(K−2)/2.

7. The push-pull X-axis magnetoresistive sensor according to claim 6, wherein in the any $J^{th}$ interlocked gap column, nJ elements are selected randomly from the odd or even push arm set A11(J) or B11(J): n1≥J≥1 or n2≥J≥1, and nJ≥1;

$a_{1,J}, a_{2,J}, a_{3,J}, \ldots, a_{n,J}$, wherein a difference between two adjacent elements is greater than 2, and there exists:

$a_{11,J}=a_{1,J}\pm1, a_{21,J}=a_{2,J}\pm1, a_{31,J}=a_{3,J}\pm1, \ldots, a_{n1,J}=a_{n,J}\pm1$ Push(J) sets are formed as:

Push(J)=$[a_{1,J}, a_{11,J}, a_{2,J}, a_{21,J}, a_{3,J}, a_{31,J}, \ldots, a_{n,J}, a_{n1,J}]$ and $[-a_{1,J}, -a_{11,J}, -a_{2,J}, -a_{22,J}, -a_{3,J}, -a_{31,J}, \ldots, -a_{n,J}, -a_{n1,J}]$, and there exists $a_{10,J}=a_{1,J}\pm0.5, a_{110,J}=a_{11,J}\pm0.5, a_{20,J}=a_{2,J}\pm0.5, a_{210,J}=a_{21,J}\pm0.5, a_{30,J}=a_{3,J}\pm0.5, a_{310,J}=a_{31,J}\pm0.5, \ldots, a_{n0,J}=a_{n,J}\pm0.5, a_{n10,J}=a_{n1,J}\pm0.5$ Pull(J) sets are formed as:

Pull(J)=$[a_{10,J}, a_{110,J}, a_{20,J}, a_{210,J}, a_{30,J}, a_{310,J}, \ldots, a_{n0,J}, a_{n10,J}]$ and $[-a_{10,J}, -a_{110,J}, -a_{20,J}, -a_{210,J}, -a_{30,J}, -a_{310,J}, \ldots, -a_{n0,J}, -a_{n10,J}]$, and wherein the push magnetoresistive sensing unit strings in the Pull(J) sets form the push magnetoresistive sensing unit strings of the $J^{th}$ interlocked gap column, and the pull magnetoresistive sensing unit strings in the Pull(J) sets form the pull magnetoresistive sensing unit strings of the $J^{th}$ interlocked gap column.

8. The push-pull X-axis magnetoresistive sensor according to claim 7, wherein when the interlocked array of soft ferromagnetic flux concentrators is formed by M interlocked gap columns for the $J^{th}$ interlocked gap column, one Pull(J) and one Push(J) are present, thus forming a Pull set: Pull={Pull(1), Pull(2), Pull(3), . . . , Pull(M)}, and a Push set: Push={Push(1), Push(2), Push(3), Push(M)}, and wherein the push arm of the push-pull X-axis magnetoresistive sensor is a serial connection between the push magnetoresistive sensing unit strings corresponding to the Push(J) sets corresponding to the J columns, and the pull arm is a serial connection between the pull magnetoresistive sensing unit strings corresponding to the Pull(J) sets corresponding to the J columns.

9. The push-pull X-axis magnetoresistive sensor according to claim 4, wherein when two magnetoresistive sensing unit strings having identical resistances are located simultaneously at a first-type non-interlocked gap formed by two H-shaped soft ferromagnetic flux concentrators, the magnetoresistive sensing unit strings are combined into one magnetoresistive sensing unit string, and a resistance thereof is twice that of any of the two magnetoresistive sensing unit strings.

10. The push-pull X-axis magnetoresistive sensor according to claim 1, wherein the push-pull bridge sensor may be formed through connection as a half-bridge, full-bridge, or quasi-bridge structure.

11. The push-pull X-axis magnetoresistive sensor according to claim 1,
wherein the magnetoresistive sensing units are GMR spin valves or TMR sensing units, and
wherein the directions of pinning layers are parallel to the X-axis, and the directions of free layers are parallel to the Y-axis.

12. The push-pull X-axis magnetoresistive sensor according to claim 1, wherein in the presence of an external magnetic field, the magnetoresistive sensing units make magnetization directions of magnetic free layers perpendicular to magnetization directions of magnetic pinning layers thereof by permanent magnet biasing, double exchange interaction, shape anisotropy or any combination thereof.

13. The push-pull X-axis magnetoresistive sensor according to claim 1, wherein the push arm and the pull arm have the same quantity of magnetoresistive sensing units.

14. The push-pull X-axis magnetoresistive sensor according to claim 2,
wherein the calibration coil comprises push straight calibration conductors and pull straight calibration conductors,
wherein a position relation between the push straight calibration conductor and the push magnetoresistive sensing unit string is the same as that between the pull straight calibration conductor and the pull magnetoresistive sensing unit string,
wherein the position relation is that the straight conductor is located directly above or directly below the corresponding magnetoresistive sensing unit string, and
wherein the push straight calibration conductor and the pull straight calibration conductor are connected in series and have opposite current directions.

15. The push-pull X-axis magnetoresistive sensor according to claim 2,
wherein the initialization coil is a planar coil, and
wherein the straight initialization conductors comprised therein are perpendicular to the push magnetoresistive sensing unit string and the pull magnetoresistive sensing unit string, are located directly above or directly below each magnetoresistive sensing unit string, and have identical current directions.

16. The push-pull X-axis magnetoresistive sensor according to claim 2,
wherein the calibration coil comprises a positive port and a negative port, and
wherein when a current flows through the two ports, an amplitude range of a calibration magnetic field generated thereby is within a linear working area of the magnetoresistive sensing unit.

17. The push-pull X-axis magnetoresistive sensor according to claim 2, wherein the calibration current is set to one current value or multiple current values.

18. The push-pull X-axis magnetoresistive sensor according to claim 2,
wherein the initialization coil comprises two ports, and
wherein when a current flows through the two ports, the magnitude of an initialization magnetic field generated thereby is higher than a saturated magnetic field value of the magnetoresistive sensing unit.

19. The push-pull X-axis magnetoresistive sensor according to claim 2, wherein the initialization current is a pulse current or a direct current.

20. The push-pull X-axis magnetoresistive sensor according to claim 2, wherein the initialization coil and the calibration coil are made of a high-conductivity material comprising Cu, Au, or Ag.

21. The push-pull X-axis magnetoresistive sensor according to claim 1, wherein the soft ferromagnetic flux concentrator is made of an alloy soft ferromagnetic material that comprises one or more elements of Fe, Ni, Co, and the like.

22. The push-pull X-axis magnetoresistive sensor according to claim 1,
wherein the material of the substrate is glass or a silicon wafer, and
wherein the substrate comprises an ASIC or the substrate is connected to another ASIC chip.

23. The push-pull X-axis magnetoresistive sensor according to claim 2, wherein the initialization coil and/or the calibration coil are/is located above the substrate and below the magnetoresistive sensing unit, or between the magnetoresistive sensing unit and the soft ferromagnetic flux guide, or above the soft ferromagnetic flux guide.

24. The push-pull X-axis magnetoresistive sensor according to claim 2,
wherein the initialization coil and/or the calibration coil are/is isolated from the interlocked U-shaped or/and H-shaped soft ferromagnetic flux guides and the push-pull magnetoresistive bridge sensing unit by using an insulating material, and
wherein the insulating material is $SiO_2$, $Al_2O_3$, $Si_3N_4$, polyimide, or photoresist.

* * * * *